United States Patent

Nishi

[11] Patent Number: 5,995,234
[45] Date of Patent: *Nov. 30, 1999

[54] METHOD AND APPARATUS FOR THE ALIGNMENT OF A SUBSTRATE

[75] Inventor: Kenji Nishi, Kawasaki, Japan

[73] Assignee: Nikon Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/784,544

[22] Filed: Jan. 21, 1997

Related U.S. Application Data

[62] Division of application No. 08/224,743, Apr. 7, 1994, Pat. No. 5,657,129, which is a division of application No. 08/136,991, Oct. 18, 1993, abandoned, which is a continuation of application No. 07/722,157, Jun. 27, 1991, abandoned.

[30] Foreign Application Priority Data

Jul. 5, 1990 [JP] Japan ................................. 2-178228

[51] Int. Cl.⁶ ............................................. G01B 11/00
[52] U.S. Cl. .............................................................. 356/401
[58] Field of Search .................... 356/399–401, 356/375; 250/559.3, 548; 355/43, 53

[56] References Cited

U.S. PATENT DOCUMENTS

| | | | |
|---|---|---|---|
| 4,860,374 | 8/1989 | Murakami et al. | 356/375 X |
| 4,962,318 | 10/1990 | Nishi | 356/401 |
| 5,153,678 | 10/1992 | Ota | 356/401 |

*Primary Examiner*—K. P. Hantis
*Attorney, Agent, or Firm*—Vorys, Sater, Seymour and Pease LLP

[57] ABSTRACT

Method comprises a process for obtaining a photoelectric signal with a waveform having a pair of extremal values at respective positions corresponding to a pair of edge portions of an alignment mark by photoelectrically detecting the reflected light from the alignment mark on a substrate; a first determination process for determining the position of the alignment mark on the basis of a pair of slope portions existing inside the pair of extremal values of the photoelectric signal waveform; a second determination process for determining the position of the alignment mark on the basis of a pair of slope portions existing outside the pair of extremal values of the photoelectric signal waveform; a third determination process for determining the position of the alignment mark on the basis of both a pair of slope portions existing inside said pair of extremal values of the photoelectric signal waveform and a pair of slope portions existing outside; and a process for selecting any one of the first determination process, second determination process, or third determination process in accordance with the objective alignment accuracy of the substrate.

20 Claims, 20 Drawing Sheets

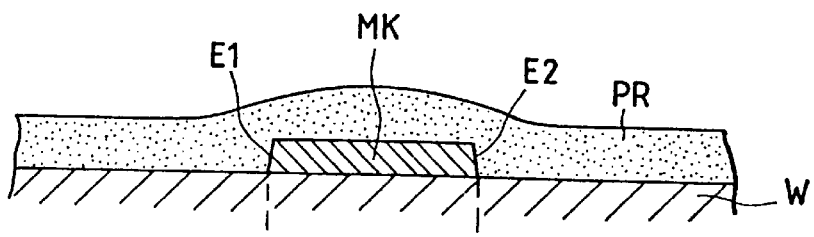
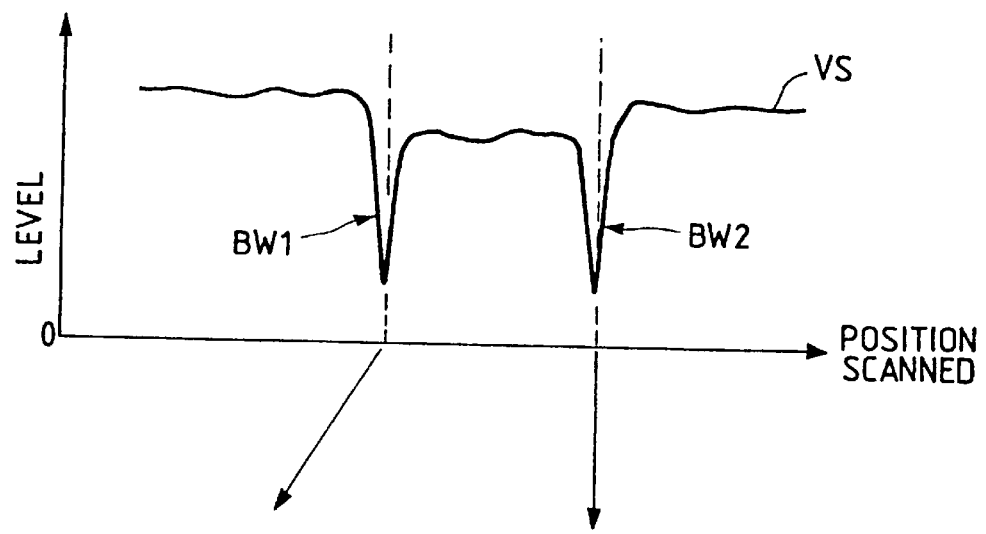
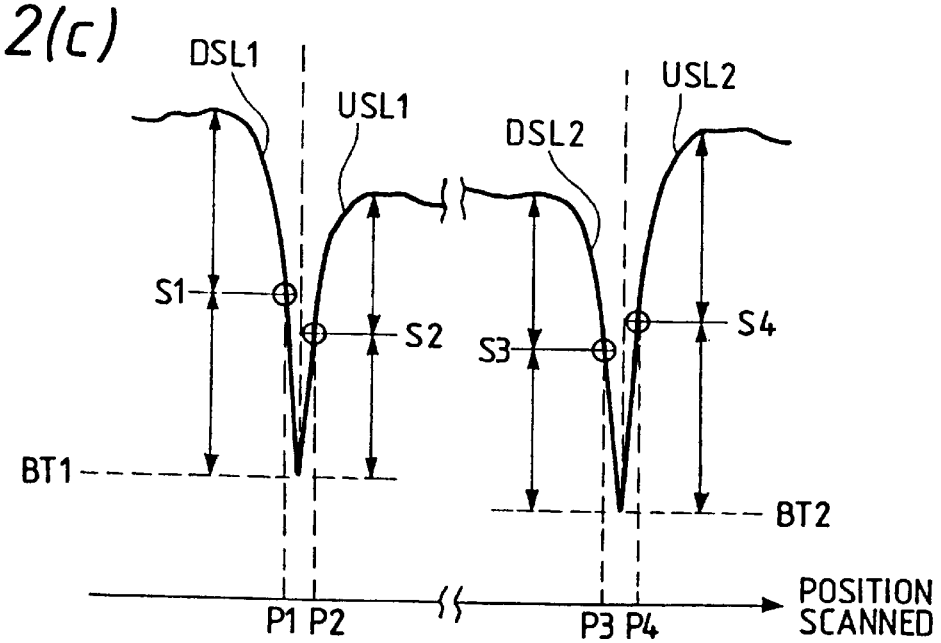

FIG. 4
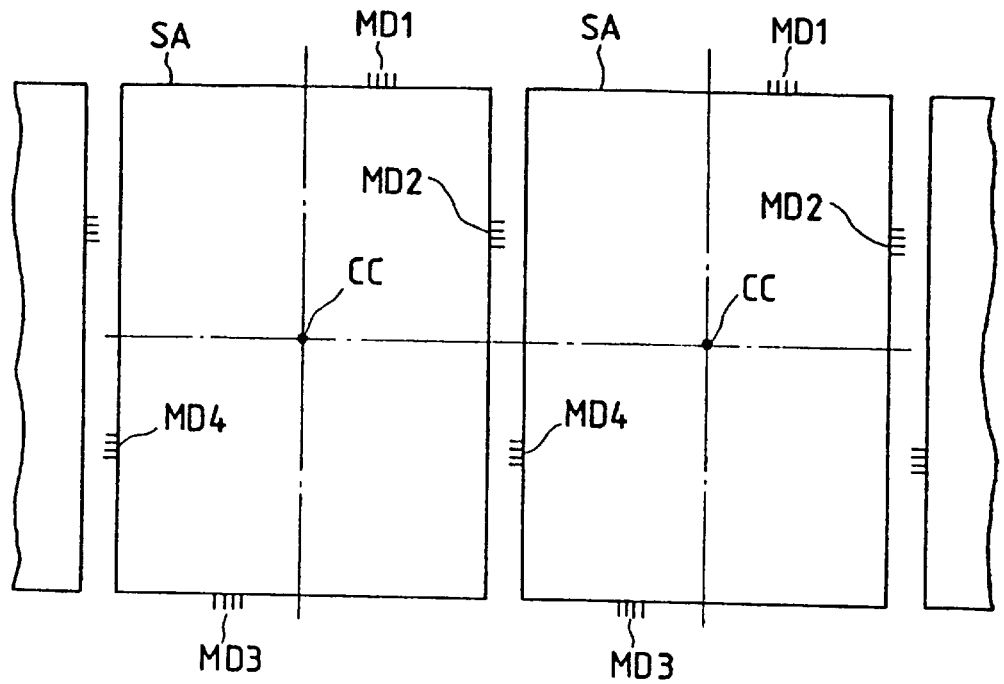
FIG. 5
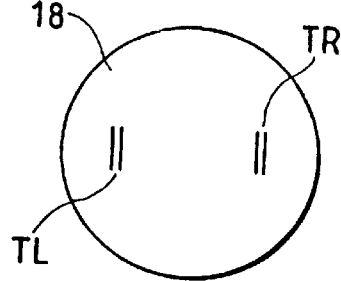
FIG. 6 (a)
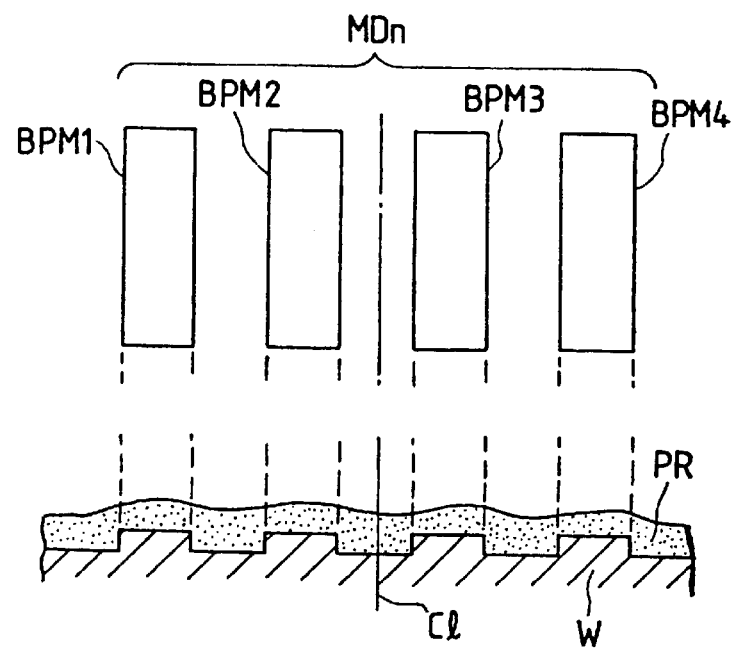
FIG. 6(b)

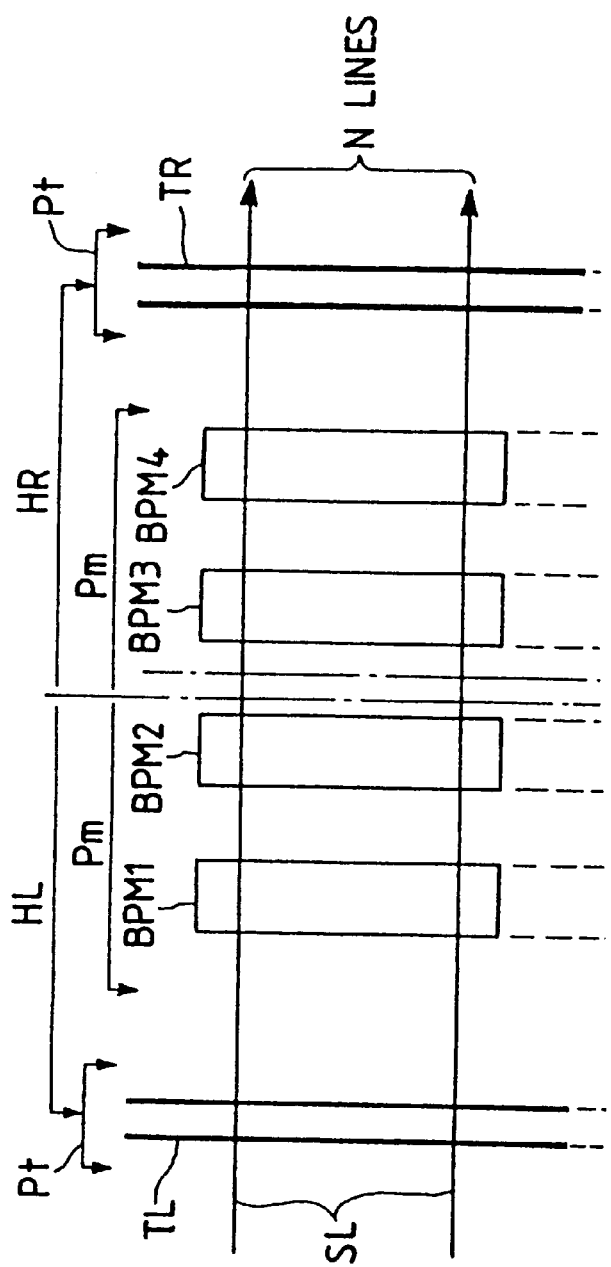
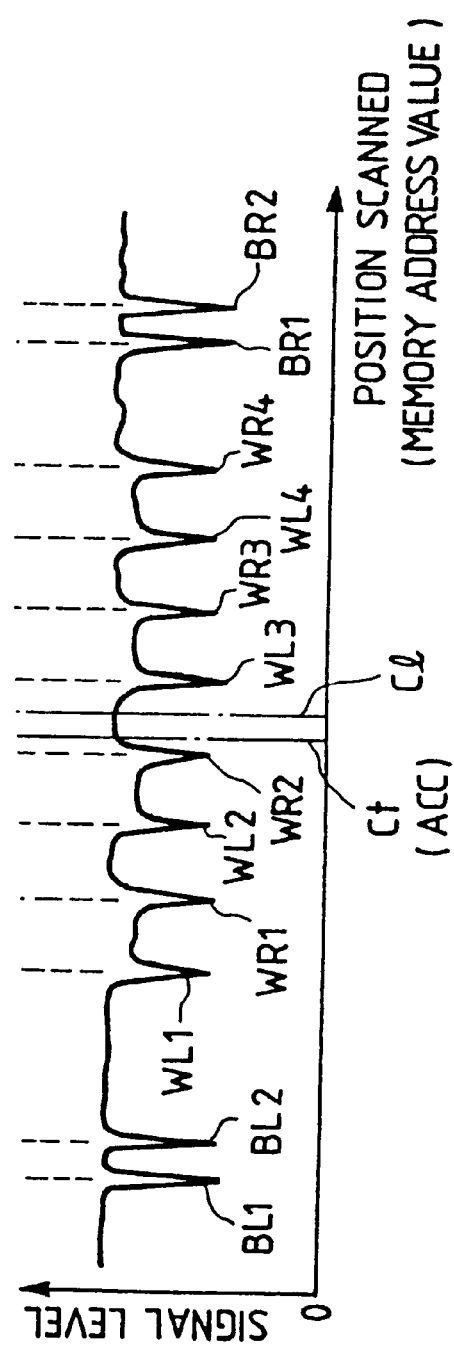
FIG. 7(a)
FIG. 7(b)

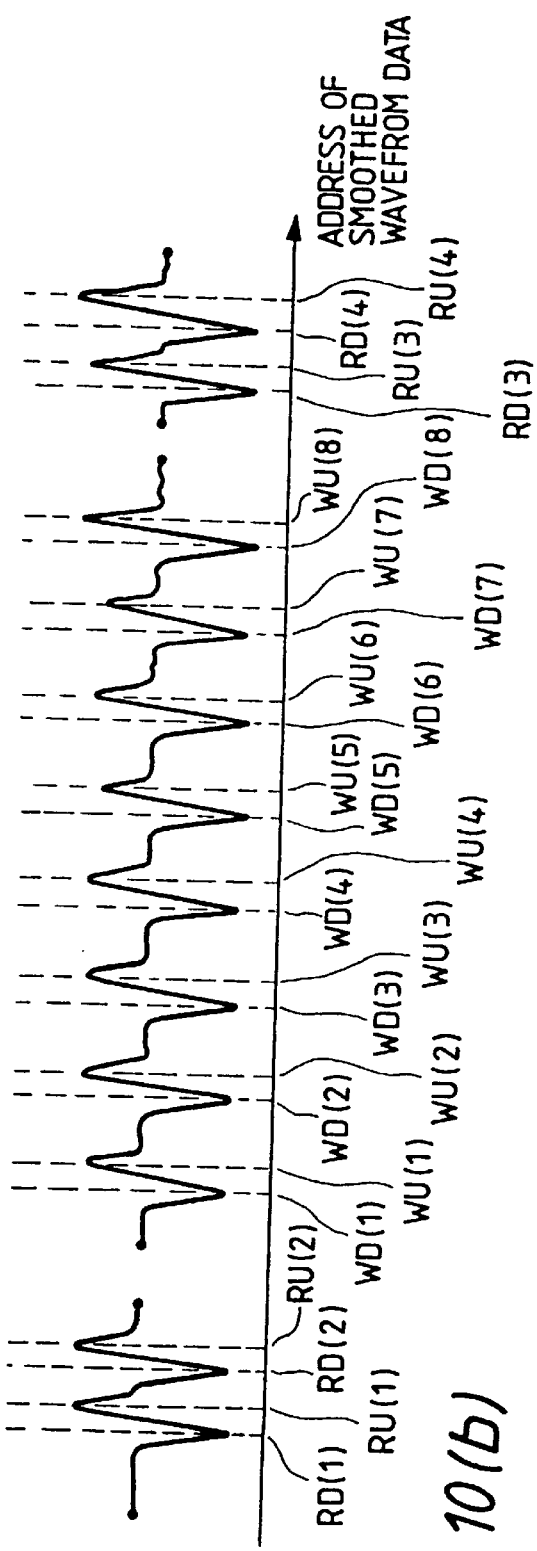
FIG. 10(a)
FIG. 10(b)

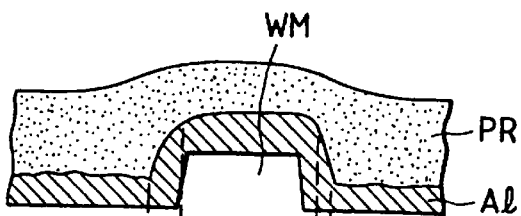
FIG. 13 (a)
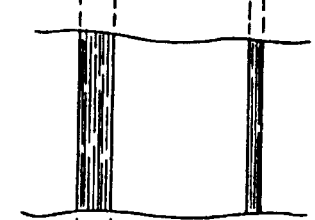
FIG. 13 (b)
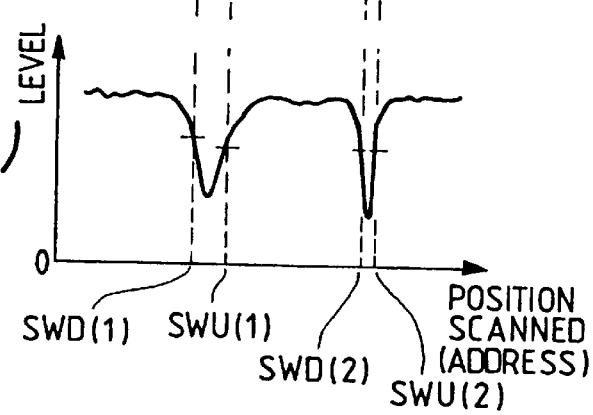
FIG. 13 (c)
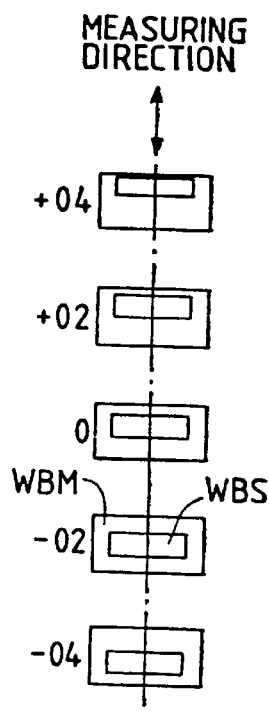
FIG. 16
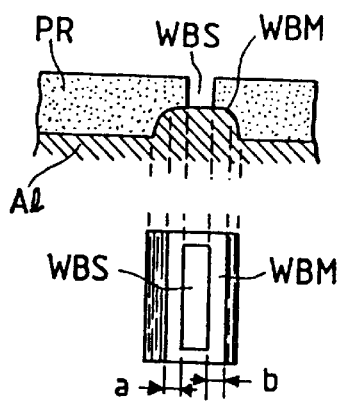
FIG. 14 (a)
FIG. 14 (b)
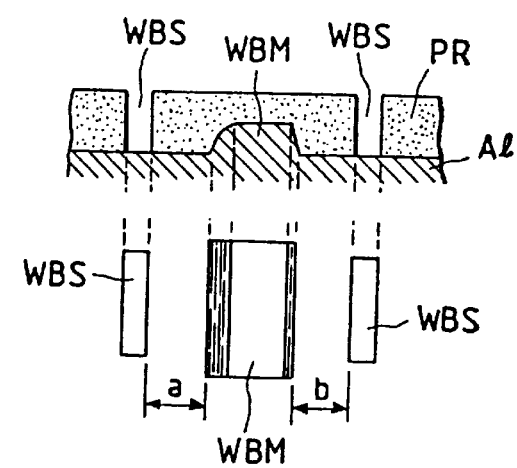
FIG. 15 (a)
FIG. 15 (b)

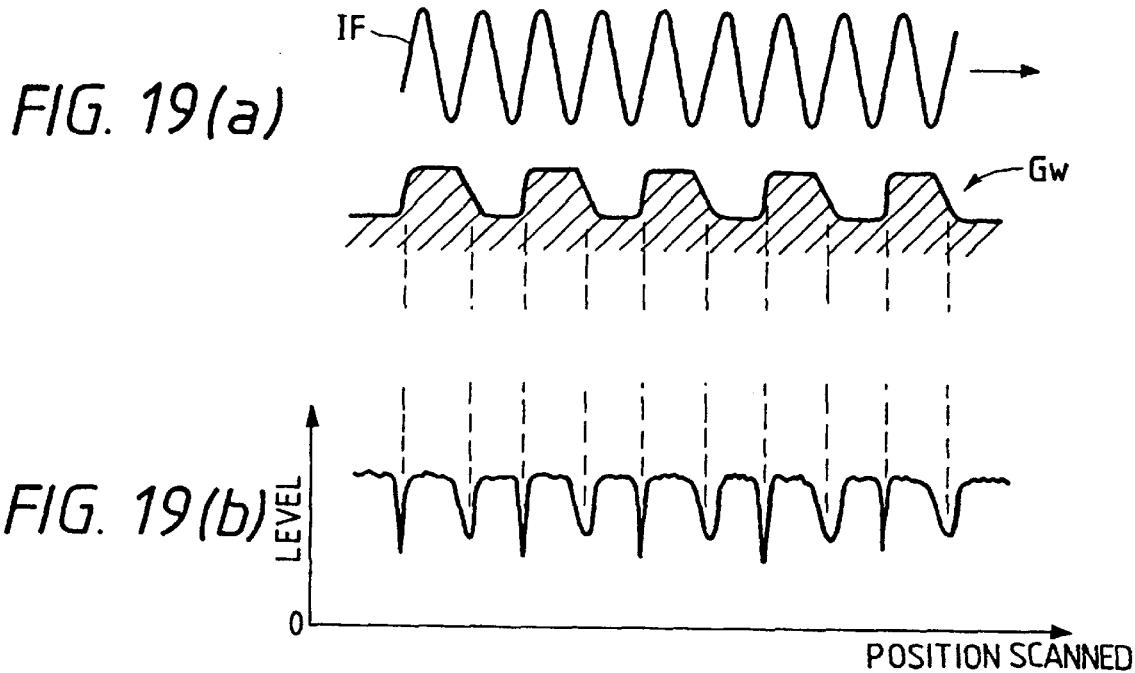
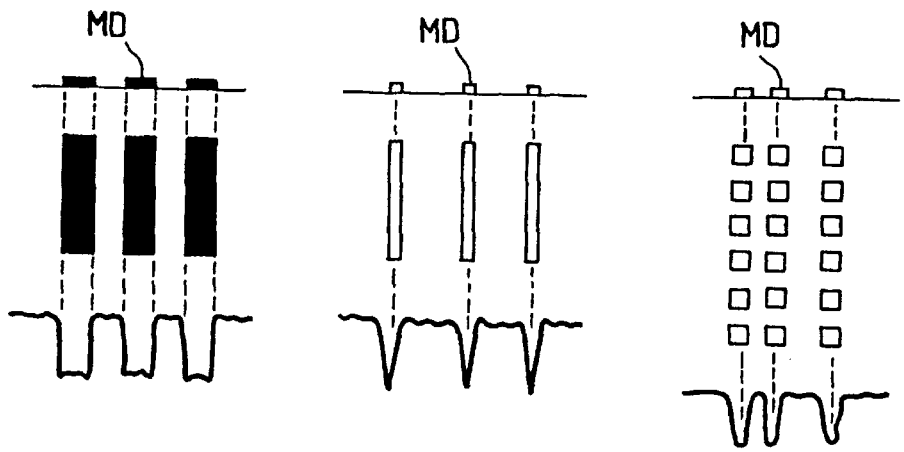

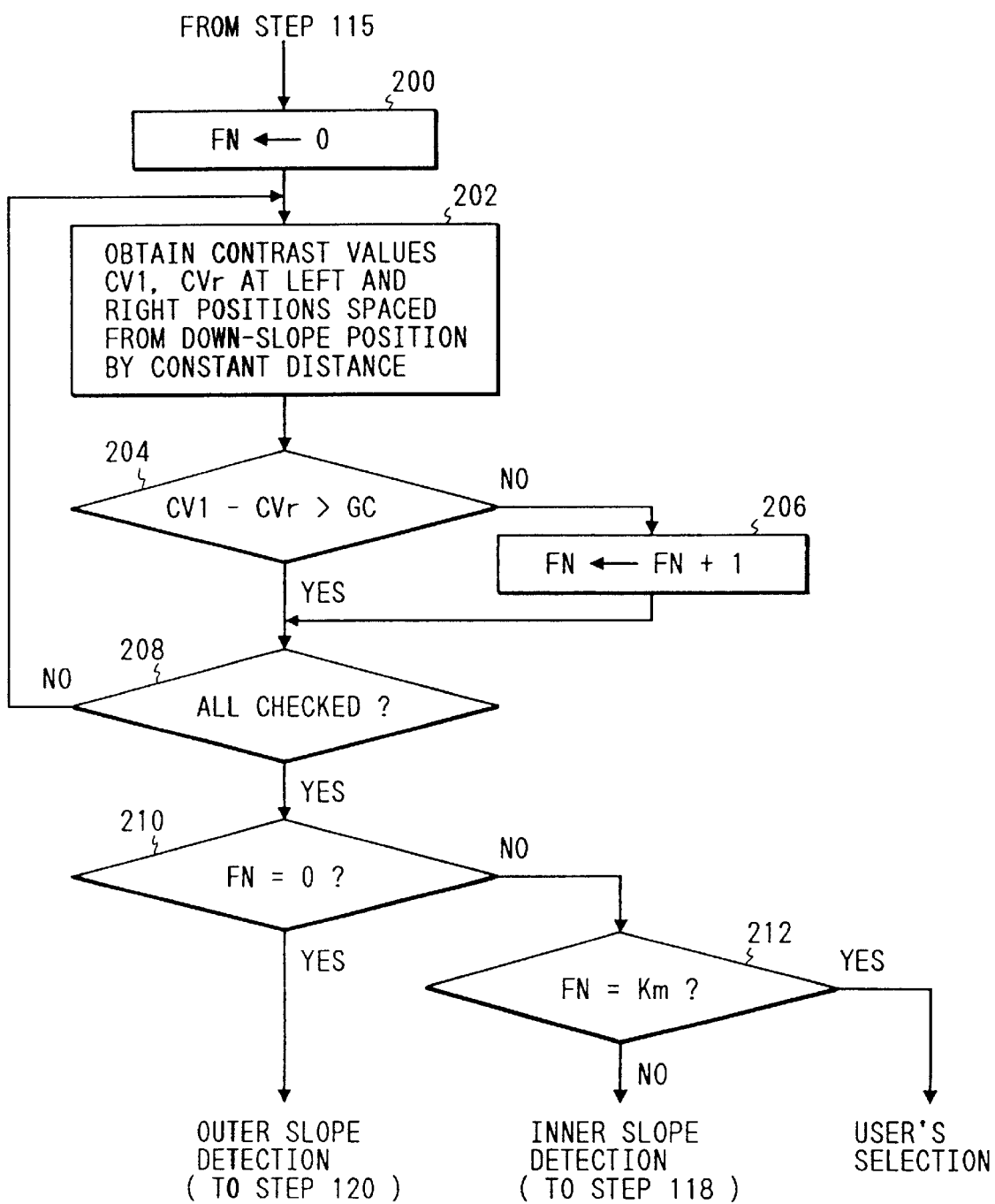

METHOD AND APPARATUS FOR THE ALIGNMENT OF A SUBSTRATE

This is a division of application Ser. No. 08/224,743 filed Apr. 7, 1994 (now U.S. Pat. No. 5,657,129); which is a division of application Ser. No. 08/136,991 filed Oct. 18, 1993 (abandoned); which is a continuation of application Ser. No. 07/722,157 filed Jun. 27, 1991 (abandoned).

BACKGROUND OF THE INVENTION

1. Field of the Invention

The present invention relates to a method and apparatus for performing alignment by photoelectrically detecting the alignment mark formed on a semiconductor wafer, a plate for liquid crystal display, or the like.

2. Related Background Art

Traditionally, there has been generally used in positioning the wafer, plate, or the like (in alignment), a method of photoelectrically detecting the alignment mark formed at a predetermined position on a substrate through the objective lens of a microscope.

The photoelectric detection method is roughly divided into two kinds, i.e., the light beam scanning method in which the mark is relatively scanned by the spot of a laser beam or the like, and the scattering rays of light or refraction light generated by the mark is received by a photomultiplier, photodiode, or the like; and the method which utilizes image signals obtained by a television camera (Vidicon tube or CCD) picking up the enlarged image of a mark evenly illuminated.

In either case, the waveform of such photosignal is processed to obtain the central position of the mark.

Although the light beam method and the pick-up method are completely different in its structures of scanning system, these two are considered here as an electrical-optical scanner, respectively (hereinafter referred to as E.O.S.).

Among such E.O.S.'s, there is known a technique as a method of detecting the mark position by carrying the wafer stage one-dimensionally against the laser beam spot such as disclosed in U.S. Pat. No. 4,655,598, U.S. Pat. No. 4,677,301, and U.S. Pat. No. 4,702,606.

Also, there is known a technique as a method of detecting the mark position within the region of the one-dimensional scanning subsequent to the positioning of the wafer stage by a designed value such as disclosed in U.S. Pat. No. 4,390,279, and U.S. Pat. No. 4,566,795.

Also, as an E.O.S. using a pick-up method, there is known a technique such as disclosed in U.S. Pat. No. 4,402,596, U.S. Pat. No. 4,679,942, and U.S. Pat. No. 4,860,374.

In these conventional techniques, a monochromatic light is used as a scanning beam or mark illuminating light mainly for two reasons given below.

1. In a projection type aligner (stepper), a single-wavelength illuminating light or laser beam is used in order to avoid any large chromic aberration for the type which detects the wafer mark through the projecting optical system.

2. A monochromatic laser beam is used to enable a fine spot convergence of the beam for performing a high-luminance and high-resolution detection. When a monochromatic illuminating light (or beam) is used as set forth above, the obtainable S/N ratio is comparatively large. However, there appears an interference phenomenon due to the monochromaticity because a photoresist layer of 0.5 $\mu$m–2 $\mu$m thick is usually formed all over the wafer surface, and this often results in a detection error when the mark position is detected or makes an objective image unclear.

Therefore, in order to reduce the interference phenomenon caused by the resist, there has been proposed in recent years the application of multi-wavelength or wide band to the illuminating light.

For example, an illuminating light is produced by a halogen lamp or the like for the pick-up type E.O.S., and if the wavelength bandwidth thereof is set for approximately 300 nm (with the exception of the photosensitive region for the resist), the coherence of the rays themselves reflected from the resist surface and the wafer surface almost disappears; thus making it possible to carry out the detection on a clear image. Therefore, in the pick-up method, if only a white (wide band) illuminating light is used with an achromatic image-formation optical system, an extremely precise alignment sensor which is not affected by the resist is obtainable.

As the above describes, with the application of a polychromatic or white illuminating light, it becomes possible to restrict the generation of the interference fringe for an excellent image detection. Then, the extremely small factors causing errors which have passed unnoticed come to the fore.

In other words, since the staged structure of the alignment mark is clearly detected, a slight difference in the profiles of the mark edges becomes capable of affecting the precision of the detection or alignment.

Traditionally, various algorithms have been worked out for image signal processings. However, none of them have ever taken into consideration such slight changes in the mark edge profiles, and there has automatically been a limit for an overall improvement of the alignment accuracy.

SUMMARY OF THE INVENTION

The present invention is designed in consideration of such problems as mentioned above, and the object thereof is to improve the alignment accuracy.

The present invention relates to a method and apparatus for photoelectrically detecting the optical information originating from the alignment mark on a substrate such as a wafer by an E.O.S. such as a television camera and scanning laser to determine the position of the alignment mark by processing the time series photoelectric signal (image signal) which changes its intensity with respect to the relative scanning direction of the alignment mark.

The present invention is designed to provide the processes given below:

- a process to obtain a photoelectric signal waveform which has extremal value at respective positions of a pair of mark edge portions which define the mark width;
- a first determination process to determine the mark position based on a pair of slope portions existing inside the two extremal values in the photoelectric waveform;
- a second determination process to determine the mark position based on a pair of slope portions existing outside the two extremal values;
- a third determination process to determine the mark position based on the slope portions existing both inside and outside the extremal values; and
- a process to select any one of the first determination process, second determination process, or third determination process in accordance with the target alignment precision for the substrate.

Fundamentally, the waveform processings of the signal shown in FIG. 2 is performed in the present invention.

FIG. 2(a) shows the cross-sectional structure of a convex mark MK formed on a wafer W with the resist layer PR covered evenly over the surface thereof.

FIG. 2(b) shows the waveform of video signal VS of the image of the mark MK picked up by a television camera along the scanning line across the edges E1 and E2 of the mark MK. This video signal VS represents the bottom waveforms BW1 and BW2 which become minimal values at the positions of both edges E1 and E2 of the mark MK. The waveform level between the bottom waveform portion BW1 and BW2 varies by the reflectance of the mark MK itself, and the waveform level on the left side of the bottom waveform portion BW1 and the waveform level on the right side of the bottom waveform portion BW2 vary by the reflectance of the wafer substrate.

FIG. 2(c) is an enlarged representation of the two bottom waveform portions BW1 and BW2. The bottom waveform portion BW1 has a down-slope portion DSL1 which falls down to the bottom level BT1 as the scanning advances, and an up-slope portion USL1 which rises from the bottom level BT1. Likewise, the bottom waveform portion BW2 has a down-slope portion DSL2 which falls down to the bottom level BT2 and a up-slope portion USL2 which rises from the bottom level BT2.

In the present invention, the central position of the mark MK with respect to the scanning direction is determined by selectively using the bottom waveform portion BW1 and BW2, and the slope portions DSL1, USL1, DSL2, and USL2 corresponding respectively to both edges E1 and E2 of the mark MK.

In each of the slope portions, those slope portions existing inside are the up-slope portion USL1 and the down-slope portion DSL2, and those slope portions existing outside are the down-slope portion DSL1 and the up-slope portion USL2.

In practice, the process is executed to obtain the scanned position P1 where the slope portion DSL1 coincides with the slice level S1 which divides between the peak value at the shoulder of the down-slope portion DSL1 and the bottom level BT1 in one bottom waveform portion BW1 by a predetermined ratio (50%, for example), and the scanned position P2 where the slope portion USL1 coincides with the slice level S2 which divides between the peak value at the shoulder portion of the up-slope portion USL1 and the bottom level BT1 by a predetermined ratio.

Likewise, for the other waveform portion BW2, the process is executed to determine the position P3 obtained by comparing the down-slope portion DSL2 with the slice level S3 and the position P4 obtained by comparing the up-slope portion USL2 with the slice level S4.

Therefore, the computation of the central position Pm of the mark MK is fundamentally performed in accordance with any one of the three equations given below.

$$Pm=(P2+P3)/2 \quad (1)$$

$$Pm=(P1+P4)/2 \quad (2)$$

$$Pm=(P1+P2+P3+P4)/4 \quad (3)$$

Here, the equation (1) is the basic expression to determine the inside slope; (2), the outside slope; and (3), both slopes.

Then, in the present invention, the alignment of a wafer is executed by selecting the determining equation which optimizes the precision whereby an actual wafer is aligned, for example.

In this respect, while the present invention is equally applicable to the alignment method employed for the synchroton orbital radiation (SOR) X-ray aligner, it is desirable to prepare an objective lens system having an additional double-focusing element so that the marks of the mask and wafer are detected simultaneously because in the X-ray aligning, the mark and wafer approach with a predetermined gap.

BRIEF DESCRIPTION OF THE DRAWINGS

FIGS. 2(a) to (c) are views showing the mark cross-section and signal waveform illustrating the principle of the present invention;

FIG. 4 is a plan view showing the shot array and mark arrangement on a wafer;

FIG. 5 is a plan view showing the mark arrangement on an index plate;

FIGS. 6(a) and (b) are views showing the shape of wafer mark and sectional structure;

FIGS. 7(a) and (b) are views showing the arrangements of the index mark and wafer mark at the time of alignment and the waveform of the video signal from the CCD camera;

FIGS. 13(a) to (c) are views showing the structure of asymmetric mark and its signal waveform;

FIGS. 14(a), (b), 15(a) and (b) are views illustrating the difference in the vernier configurations respectively;

FIG. 16 is a view illustrating the vernier reading;

FIGS. 19(a) and (b) are views showing the sectional structure of lattice mark used for a coherent alignment method and its signal waveform;

FIGS. 20A, 20B, and 20C are views showing the variations of the wafer mark shape respectively;

FIG. 21 is a flowchart illustrating the procedure for selecting the optimum mode by automatically collating the number of the wafer marks and that of edge bottom waveforms;

DETAILED DESCRIPTION OF THE PREFERRED EMBODIMENTS

At first, in reference to FIG. 1, the structure of a stepper suited for implementing the method according to an embodiment of the present invention will be described.

Figure 1:
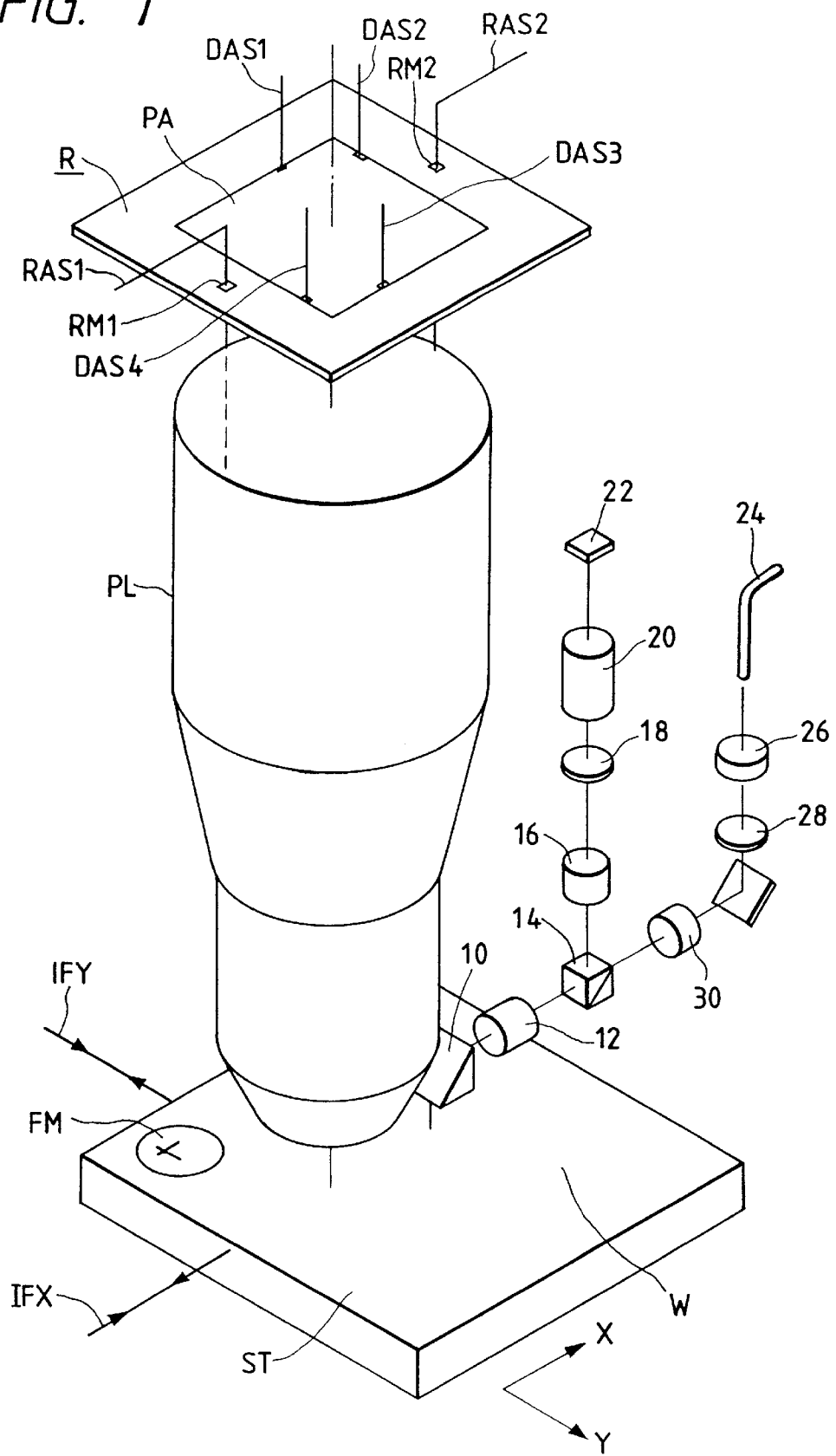
FIG. 1 is a perspective view showing the structure of a stepper suitably implementing the method according to an embodiment of the present invention.

In FIG. 1, an image in the pattern region PA on a reticle R is projected to form its image on the wafer W through a projection lens PL. The wafer W is mounted on a stage ST movable in the directions X and Y by the step-and-repeat method, and the coordinate position of the stage ST is measured by interferometers IFX and IFY. The reticle R is aligned to the stepper (the optical axis of the projection lens PL) by positioning the reticle alignment marks RM1 and RM2 provided at both sides of the pattern region PA for the reticle alignment microscopes RAS1 and RAS2. Also, in the region corresponding to the peripheral street lines of the pattern region PA, a mark (window) is formed for the die-by-die alignment, and each mark (window) is detected by TTR (through-the-reticle) alignment microscopes DAS1, DAS2, DAS3, and DAS4 together with the wafer mark for the die-by-die attached to one shot region on the wafer W.

Now, the method according to the present embodiment here is applicable to a wafer alignment sensor which detects only the mark on the wafer W by the off-axis method. This wafer alignment sensor comprises a mirror 10 arranged in the close vicinity immediately below the projection lens PL, an objective lens 12, a beam splitter 14, an image-formation lens 16, a conjugate index plate 18, an image pick-up lens 20, and a CCD two-dimensional image pick-up element 22. Further, in order to illuminate the mark region on the wafer W, there is provided an illuminating optical system comprising the optical fiber 24 which induces light of wide band wavelength emitted from a halogen lamp, luminance polychromatic LED) or the like, a condenser lens 26, an illumination ranqe diaphragm 28, a lens system 30, and the beam splitter 14 which has been mentioned earlier.

In the above-mentioned structure, the wafer W is arranged conjugately with the index plate 18 optically with respect to the synthetic system of the objective lens 12 and image-formation lens 16, and the light receiving planes of the index plate 18 and CCD 22 are conjugately arranged with respect to the pick-up lens 20.

Therefore, the CCD 22 picks up the enlarged image of the mark on the wafer W and the enlarged image of the fixed (reference) mark on the index plate 18 simultaneously. Also, the emission end of the fiber 24 of the illuminating optical system is relayed as a secondary light source image to the pupil plane (aperture diaphragm position) between the objective lens 12 and the lens system 30 to provide Köhler's illumination for the wafer W. Furthermore, the range diaphragm 28 is conjugate with the wafer W by the synthetic system of the objective lens 12 and the lens system 30, and the aperture image of the range diaphragm 28 is conjugate with the wafer W. Accordingly, the aperture image of the range diaphragm 28 is projected onto the wafer W. In the present embodiment, at least for each of the objective lens 12, image-formation lens 16, pick-up lens 20, the achromatic treatment is provided so as to prevent the deterioration of the image-formation characteristics due to chromatic aberration.

Also, in the apparatus according to the present embodiment, a reference mark FM is provided on the stage ST and is used for measuring the distance (base line) between the projection point to the wafer W of the index mark on the index plate 18 in the wafer alignment sensor and the reticle alignment marks RM1 and RM2 on the reticle R or the projection point of the mark for the die-by-die.

Figure 3:
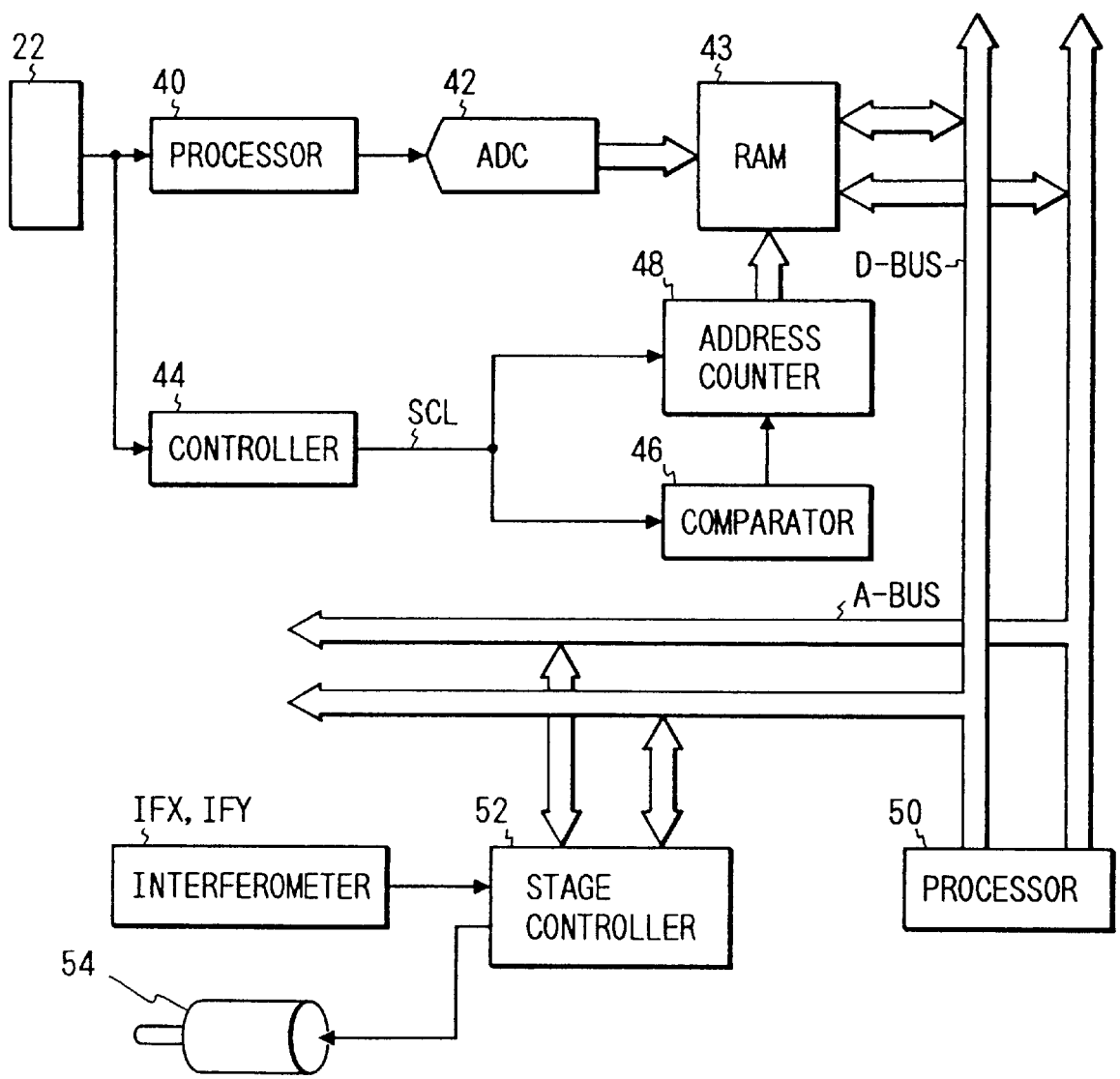
FIG. 3 is a block diagram schematically showing the signal processing system of a CCD camera.

Now, in reference to FIG. 3, the processing circuit for the video signals from the CCD 22 shown in FIG. 1 will be described. The CCD 22 is a two-dimensional pick-up element with pixels arranged in the horizontal scanning direction and vertical scanning direction. In the CCD 22 of the present embodiment, however, the horizontal scanning direction is assumed to coincide with the direction crossing the mark edges on the wafer W.

Now, from the CCD 22, a composite video signal, which is a mixture of the horizontal synchronous signal and vertical synchronous signal, is obtained. This video signal is transferred to an analog-digital converter (ADC) 42 through the preparatory circuit 40 such as a frequency filter or AGC. Meanwhile, the video signal from the CCD 22 is transferred to a controlling circuit 44 including a synchronous signal separator circuit, clock generator circuit and the like. This controlling circuit 44 outputs the clock signal SCL such that one clock pulse is generated per electrical scanning (reading scan) of one pixel in accordance with the horizontal synchronous signal from the CCD 22. This clock signal SCL is transferred to the comparator 46 which detects whether or not the electrical scanning of the CCD 22 has covered the sampling region (scanning in the vertical direction of the horizontal scanning) in one frame, and to the address counter 48 which outputs the address value to the memory (RAM) 43 for storing the output data from the ADC 42. Therefore, in the RAM 43, the digital waveform data of the scanned portion designated by the predetermined horizontal scanning by the CCD 22 is stored. The waveform data stored in the RAM 43 is read by the processor 50 through the address bus A-BUS and data bus D-BUS controlled by the process 50 to execute a given waveform processing operation. To the address bus A-BUS and data bus D-BUS of the processor 50, a stage controller 52 is connected to control the stage ST. With the input of coordinating value of the interferometers IFX and IFY, this controller 52 controls a driving motor 54 for the stage ST.

Next, in reference to FIG. 4, FIG. 5, and FIG. 6, the mark configuration and arrangement suited for tire present embodiment will be described.

FIG. 4 shows the shot arrangement on the wafer W, and the projected image in the pattern region of the reticle R is aligned with each of the shot regions SA. Then, at the time of exposure, the center CC of each of the shot regions SA coincides with the center of the pattern region PA of the reticle R. The center lines rectangular at the center CC are parallel to the X axis and Y axis of the linear coordination regulated by the interferometers of the wafer stage ST.

Now, in each of the shot regions SA, the wafer marks for the die-by-die MD1, MD2, MD3, and MD4 are formed. In the present embodiment, it is assumed that these marks MD1–MD4 are detected by the off-access wafer alignment sensors (10–30). Each of the marks MDn should be a multimark in which four bar marks BPM1, BPM2, BPM3, and BPM4 are arranged in parallel with equal intervals as shown in FIG. 6(a). Also, as shown in FIG. 6(b), the bar marks BPMn are formed convexly on the wafer substrate. The center Cl of the mark MDn is located between the bar marks BPM2 and BPM3.

Also, FIG. 5 shows the arrangement of the index marks TL and TR on the conjugate index plate 18, and each of the index marks TL and TR is formed with two fine lines of chrome layer on a transparent glass plate. In executing the alignment, the stage ST is positioned by sandwiching the mark MDn between the two index marks TL and TR. FIG. 7 shows an example of the video signal waveform thus obtained.

FIG. 7(a) illustrates the state where the wafer mark MDn is sandwiched by the index marks TL and TR, and there is a slight deviation between the center Cl of the wafer mark MDn and the center Ct of the index marks TL and TR. The processor 50 shown in FIG. 3 computes the volume of this deviation precisely. As shown in FIG. 7(b), the video signal waveform obtained along the horizontal scanning SL of the CCD 22 becomes bottom minimal value) only at the edge positions of each mark because the interference phenomenon on the resist layer is reduced by the use of the wideband illuminating light. In FIG. 7(b), the index marks TL and TR are two fine bar marks respectively. Accordingly, one bar mark thereof has one bottom waveform BL1, BL2, BR1 and BR2. Also at each of the edge positions of four bar marks BPM1–BPM4 of the wafer mark MDn, a total of eight bottom waveforms WL1, WR1, WL2, WR2, WL3, WR3, WL4 and WR4 can be obtained.

Nevertheless, the optical phenomena of the bottom waveforms appearing at the positions of the index marks TL and TR and the bottom waveforms appearing at the respective edge positions of wafer mark MDn are completely different. In other words, the index marks TL and TR are picked up on the CCD 22 as dark portions because these are illuminated by transmission by the illuminating light reflected from the wafer surface, whereas each edge of the wafer mark is picked up as dark portion (dark line) because the illuminating light is scattered at an angle larger than the aperture number (N.A.) of the objective lens 12 and the like and is not returned in the image-formation optical path to the CCD 22.

In this respect, the signal waveform shown in FIG. 7(b) is the one obtained by averaging the signal waveform obtainable along N lines of scannings SL as shown in FIG. 7(a) after summing such waveform by the pixel columns in the vertical direction. This summing and averaging is executed by the processor 50 by reading the waveform data for N lines from the RAM 43.

Subsequently, the alignment method according to the present embodiment will be described, and in the premise thereof, several parameters are set up in the processor 50 in advance. The typical parameters thereof are given below.

① A center address value ACC for the index marks TL and TR.

② A distance Lt (μm) between the index marks TL and TR on the wafer.

③ Numbers Kt for each of the index marks TL and TR.

④ Numbers Km for the wafer mark MDn.

⑤ Point numbers (address) HL and HR from the center address value ACC of the index marks TL and TR.

⑥ Point numbers (address) Pt for each processing width of the index marks TL and TR.

⑦ Point numbers (address) Pm of the processing width from the center address value ACC of the wafer mark MDn.

Of these parameters, the meanings of the point numbers HL, HR, Pt, and Pm are illustrated in FIG. 7(a).

Also, for the present embodiment, it is assumed that subsequent to the completion of a global alignment of the wafer W, the finer positional detection is performed by the use of the wafer alignment sensor. Therefore, if the index marks TL and TR and the wafer mark MDn are detected by positioning the stage ST only in accordance with the designed value of the shot arrangement on the wafer W subsequent to the global alignment, a slight irregularity of the shot arrangement or an alignment error ΔX including the expansion or contraction of the wafer (W) and the like remains to the extent of the outstanding error (±1 μm or less) at the time of the global alignment. This alignment error ΔX is the difference between the central positions Cl and Ct shown in FIG. 7.

Figure 8:
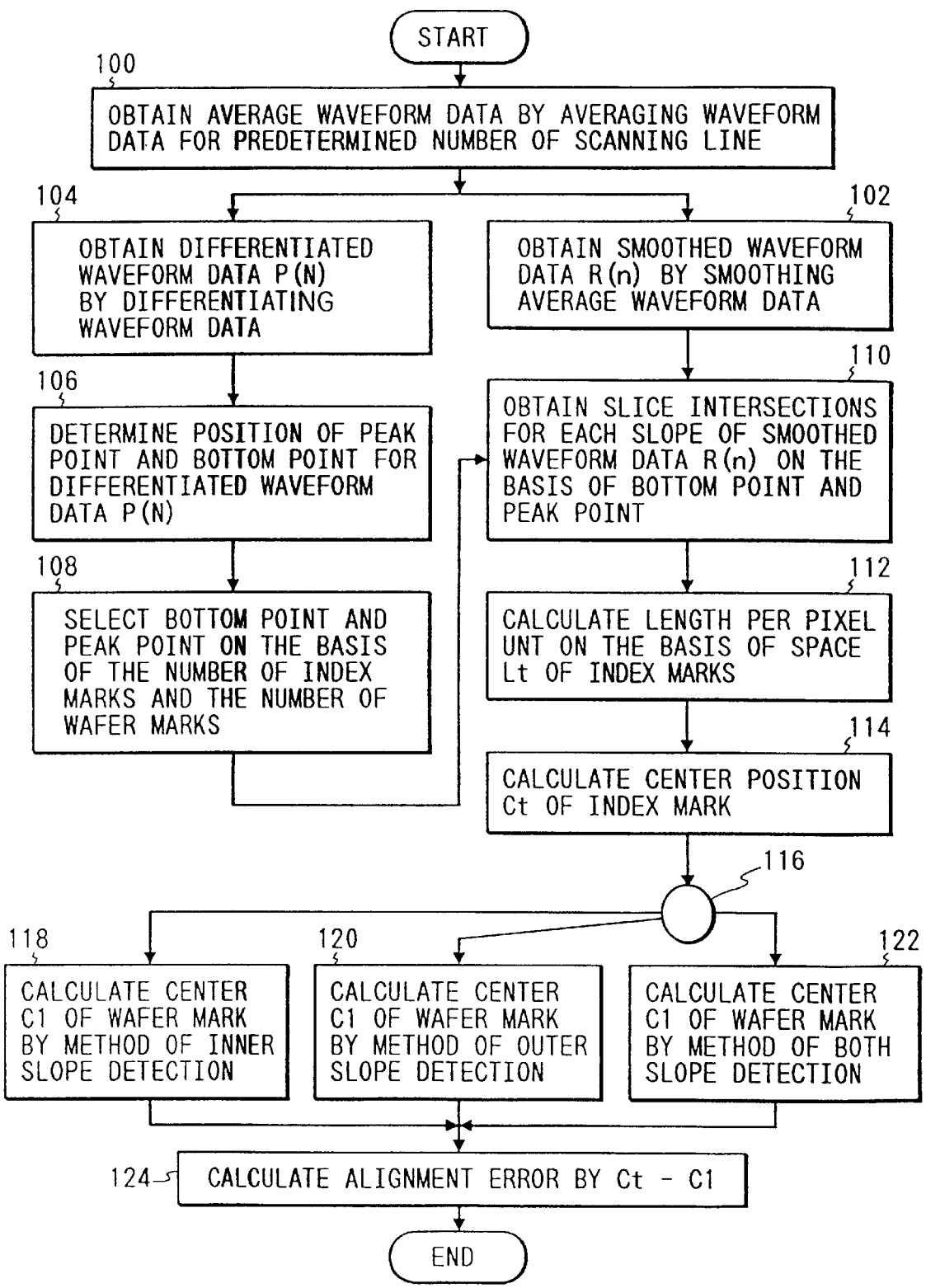
FIG. 8 is a flowchart illustrating the procedures on the alignment process in accordance with the method according to an embodiment of the present invention.

Now, when the waveform data for N lines of scannings picked up by the CCD 22 are loaded into the RAM 43, the processor 50 executes the waveform processing in the sequence shown in FIG. 8. Hereinafter, such processing will be described along each of the steps shown in FIG. 8.

[Step 100]

Here, arbitrary lines are selected from the original waveform data of N lines which have been stored in the RAM 43, and are averaged after addition per pixel in the vertical direction to produce one line of the averaged waveform data. The averaged waveform data thus produced is temporarily stored in the RAM 43.

In this respect, the scannings to be added to obtain its average are not necessarily continuous in the vertical direction. Such scanning lines may be obtained at intervals of one line or two lines.

[Step 102]

Subsequently, the processor 50 executes the smoothing of the averaged waveform data. This smoothing is carried out by allowing the averaged waveform data to pass through a numerical filter.

Figure 9A:
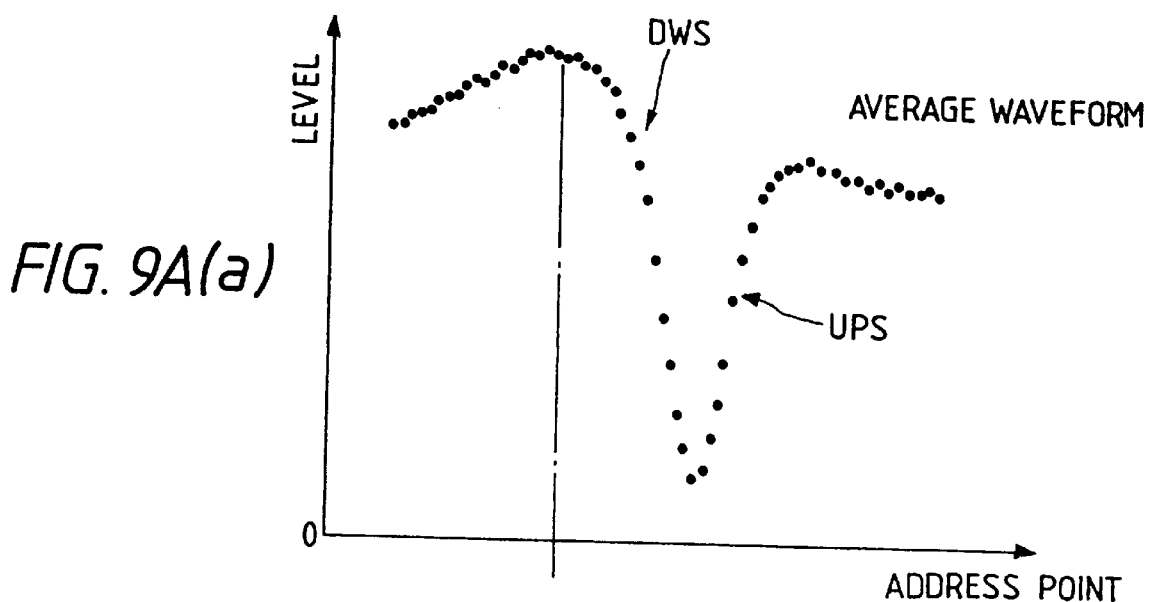
FIGS. 9A(a) to (c), 9B, 10(a) and (b), 11(a) and (b), 12A and 12B are views showing the waveforms illustrating the states of signal waveform data worked out in the course of process shown in FIG. 8.
Figure 9A:
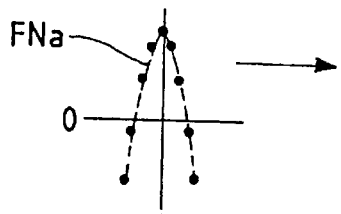
Figure 9A:
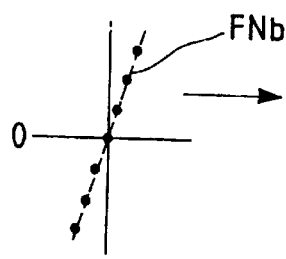

FIG. 9A(a) shows an example of the averaged waveform data in the RAM 43, and the horizontal axis represents the address point of the RAM 43 and the vertical axis represents the level. To this waveform, the numerical filter FNa shown in FIG. 9A(b) is applied; thus obtained the smoothed waveform data R(n) by removing the hiqh-frequency component existing in the averaged waveform data. This waveform data R(n) is also temporarily stored in RAM 43.

[Step 104]

Figure 9B:
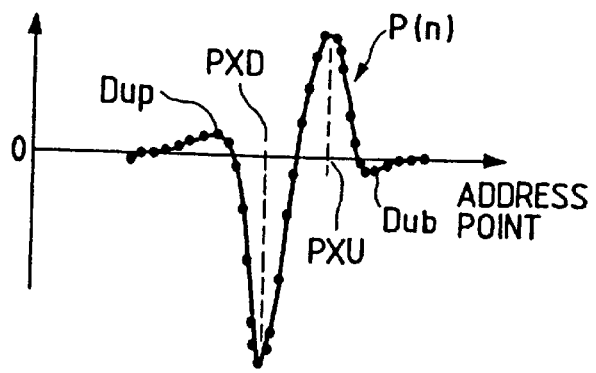

Then, the processor 50 differentiates the averaged waveform data. This differentiation is carried out by allowing the averaged waveform data to pass through the numerical filter FNb having a constant slant as shown in FIG. 9A(c). Thus the bottom waveform shown in FIG. 9A(a) becomes such differentiated waveform data P(n) as shown in FIG. 9B. The address point PXD which is the bottom point on this differentiated waveform data coincides with the intermediate point position of the down-slope portion DWS in the averaged waveform data (or smoothed waveform data), and the address point PXU which is the peak point on the differentiated waveform data coincides with the intermediate point position of the up-slope portion UPS in the averaged waveform data.

Therefore, by executing the differentiation process, all sloping positions on the smoothed waveform data can be defined. In this respect, the zero crossing point for the differentiated waveform between the address points PXD and PXU in FIG. 9B coincides with the bottom point in the waveform shown in FIG. 9A(a).

[Step 106]

Next, the processor 50 extracts all peak points and bottom points and the positions thereof in this differentiated waveform data P(n). In this case, as shown in FIG. 9B, small bottoms and peaks Dub and Dup other than the original bottoms and peaks may also be extracted.

[Step 108]

Then, the processor 50 discards these small bottoms and peaks Dub and Dup in the smaller order, and selects the bottom points and peak points in the numbers corresponding to the line numbers Kt of the index mark and the line numbers Km of the wafer mark.

As shown in FIG. 7 earlier, in the waveform processing width Pt corresponding to the index marks on the left side and right side TL and TR, it is known that two bottom waveforms are obtainable on the smoothed waveform data R(n) (index mark line number Kt=2). Therefore, in the processing width Pt, two peak points and two bottom points can be obtained on the differentiated waveform data P(n).

On the other hand, in the processing width 2 Pm corresponding to the wafer mark MDn, it is known that eight (2 Km) bottom waveforms are obtainable on the smoothed waveform data R(n). Therefore, in the processing width 2 Pm, the eight peak points and eight bottom points can be obtained on the differentiated waveform data P(n).

With the processings set forth above, the down-slope portions and up-slope portions corresponding to each of the marks on the smoothed waveform data have been defined.

FIG. 10 represents such state. FIG. 10(a) shows the smoothed waveform data; FIG. 10(b), the differentiated waveform data; and here, the horizontal axis of FIG. 10 represents the address points of the smoothed waveform data to obtain the central positions of the respective slopes in the smoothed waveform data corresponding to the peak points and bottom points on the differentiated waveform data.

The central positions of the respective slopes on the smoothed waveforms (BL1 and BL2) corresponding to the index mark TL on the left side are two down-slopes RD(1) and RD(2), and two UP-slopes RU(1) and RU(2). Also, the central positions of the respective slopes on the smoothed waveform (BR1 and BR2) corresponding to the index mark TR on the right side are two down-slopes RD(3) and RD(4) and two up-slopes RU(3) and RU(4).

Likewise, the central positions of the respective slopes on the smoothed waveforms generated at the respective edges of the four bar marks BPM1–BPM2 are down-slopes WD(1)–WD(8) and up-slopes WU(1)–WU(8).

Here, it is desirable as a method to define the down-slope and up-slope that the contrast limit is established in practice by the use of the respective contrast values (levels) between the smoothed waveforms and differentiated waveforms, and that the respective slope positions are defined in the smoothed waveforms based on the such limit value.

Figure 11A:
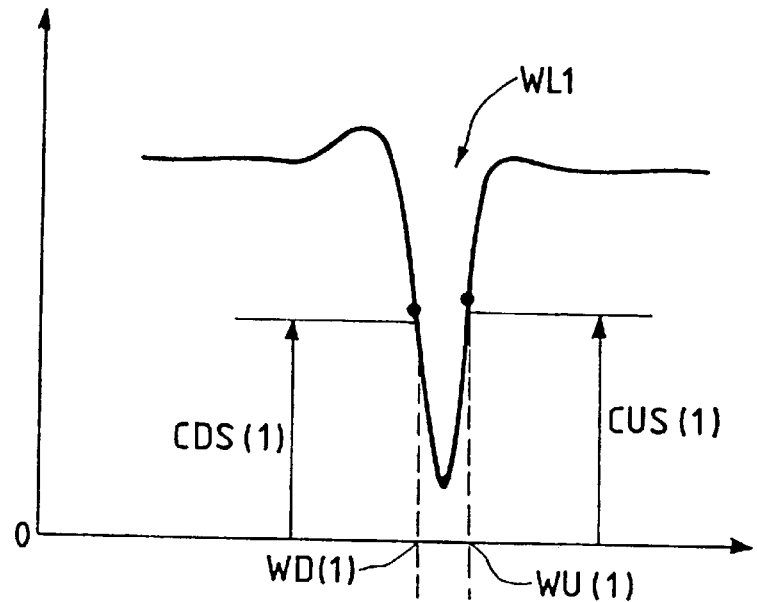
Figure 11B:
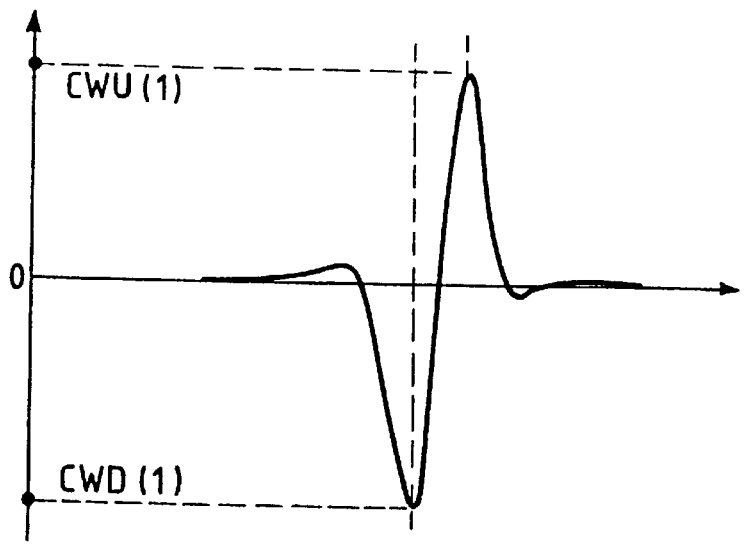

FIG. 11(a) is the enlarged representation of the bottom waveform WL1 only in those shown in FIG. 10(a). FIG. 11(b) is the enlarged representation of only the differentiated waveforms in FIG. 11(a).

At first, the absolute value of the differentiated level (contrast value) CWD(1) corresponding to the bottom position WD(1) in the differentiated waveform data is obtained. Then, the level CDS(1) in the smoothed waveform corresponding to the position WD(1) is obtained. This level CDS(1) is registered as a value slightly smaller than the level in the down-slope defined by the position CWD(1).

Subsequently, the processor works out the contrast value CVW(1) by an equation given below.

$$CVWd(1)=A \cdot CDS(1)+B \cdot CWD(1)$$

Likewise, the absolute value of the differentiated level CWU(1) corresponding to the peak position WU(1) in the differentiated waveform data is obtained. Then, the level CUS(1) in the smoothed waveform corresponding to the position WU(1) is further obtained.

Subsequently, by an equation given below the contrast value CVWu(1) is obtained.

$$CVWu(1)=A \cdot CUS(1)+B \cdot CWU(1)$$

Here A and B are constant. However, if noise should be discriminated, these are set as A=1, B=approximately 0.5.

The above-mentioned operations are executed in the signal processing region for the wafer mark and at the same time, exactly the same operations are executed for the signal waveform of the index mark.

As to the index mark, its bottom position in the differentiated waveform is RD(1), and peak position, RU(1) if the bottom waveform BL1 in FIG. 10(a) is taken as an example.

Then, assuming that the level (bottom) in the differentiated waveform at the position RD(1) is CFD(1); the level (peak) in the differentiated waveform at the position RU(1) is CFU(1); and the level in the vicinity of the center of the down-slope of the bottom waveform BL1 in the smoothed waveform is CDR(1); and the level in the vicinity of the up-slope is CUR(1), the contrast values CVRd(1) and CVRu(1) of the index mark are obtained respectively as follows:

$$CVRd(1)=A \cdot CDR(1)+B \cdot CFD(1)$$

$$CVRu(1)=A \cdot CUR(1)+B \cdot CFU(1)$$ Then, the processor obtains the contrast ratio GG of the the wafer mark to the index mark by an equation given below.

$$GG=CVWd(1)/CVRd(1) \times 100(\%)$$

or $$GG=CVWu(1)/CVRu(1) \times 100(\%)$$

Then, if this contrast ratio GG is less than the predetermined ratio, the processor judges that the bottom waveform is not the one which corresponds to the edge of the wafer mark.

[Step 110]

Subsequently, the processor 50 compares the respective slope portions in the smoothed waveform with the predetermined slice level to obtain its intersections. This step 110 may be omitted in some cases because sometimes it is possible to use the central positions of the respective slopes on the smoothed waveform obtained as shown in FIG. 10 as they are in the processes to follow thereafter.

Figure 12A:
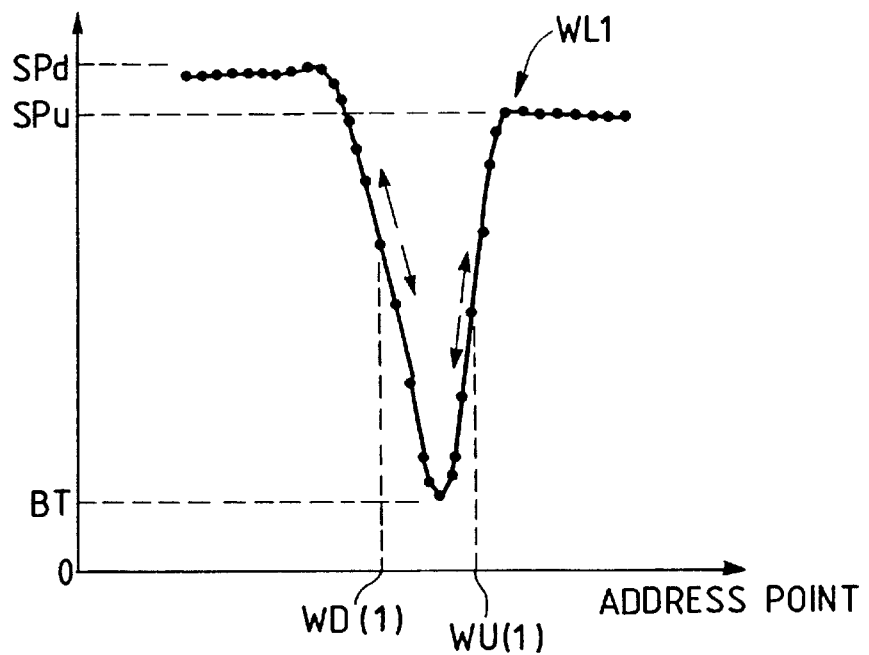
Figure 12B:
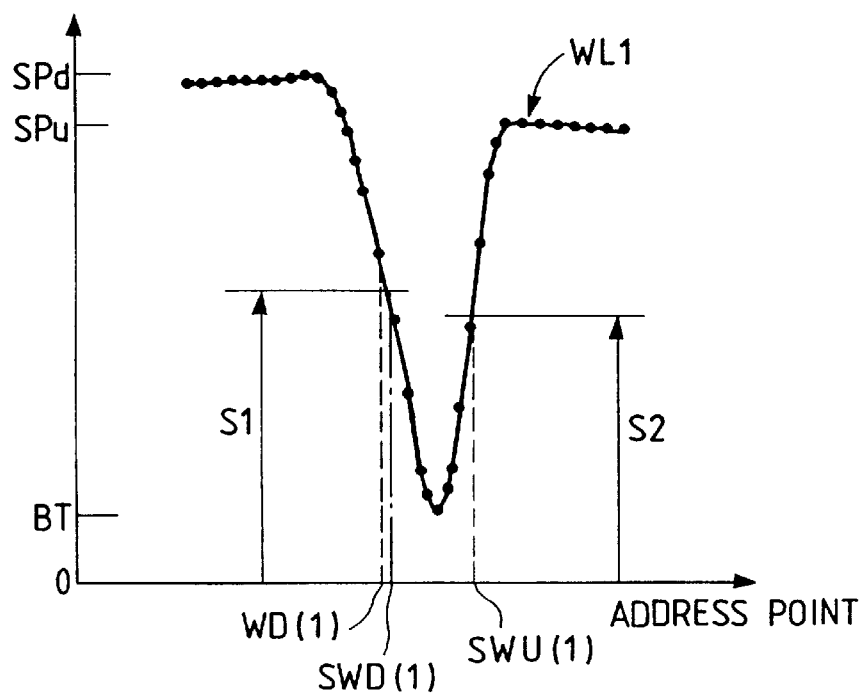

Now, at this step 110, the optimum slice level is determined for each of the slopes as described earlier in conjunction with FIG. 2(c). When this slice level is determined, each of the up-slope positions RU(1)–RU(4) and down-slope positions RD(1)–RD(4) of the index mark obtained earlier in FIG. 10 and up-slope positions WU(1)–WU(8) and down-slope positions WD(1)–WD(8) of the wafer mark are used. Now, an specific example will be described in reference to FIGS. 12A and 12B. First, as shown in FIG. 12A, the waveform data are searched fore and after in predetermined portion of point numbers (address) from the down slope position WD(1) of one bottom waveform WL1 on the smoothed waveform. Then, the minimum value BT of the bottom of the down-slope and the maximum value SPd of the shoulder of the down-slope are obtained, and as shown in FIG. 12B, the slice level S1 is defined at a location where the value between the minimum value BT and the maximum value SPd is divided by the predetermined ratio.

Here, given the ratio thereof as α(%), the slice level S1 is worked out by an equation given below.

$$S1 = (SPd - BT) \times (\alpha/100) + BT$$

Subsequently, the level position of the down-slope portion which coincides with this slice level S1 is obtained. At this juncture, if the level which coincides with the slice level S1 exists between the sampling points, the intersecting point SWD(1) is obtained by a method of the linear interpolation or the like. This position SWD(1) is, for example, represented by a real number which is obtained by interpolating the space between the address points with a 1/10.

In the same way as above, a search is carried out fore and after from the position WU(1) for the up-slope of the bottom waveform WL1 on the smoothed waveform (here, since the minimum value BT has been known, the search may be performed for one direction only), and the slice level S2 is defined by an equation given below.

$$S2 = (SPU - BT) \times (\alpha/100) + BT$$

Then, the position SWU(1) of the up-slope portion which coincides with this slice level S2 is worked out by a real number.

Thereafter, the optimum slice levels for each of the bottom waveforms in the smoothed waveform are defined in the same fashion to obtain the intersecting points SRU(1)–SRU(4), SRD(1)–SRD(4), SWU(1)–SWU(8), and SWD(1)–SWD(8).

[Step 112]

Next, the processor 50 examines one pixel of the CCD 22 (the space between the samplings of the smoothed waveform data) to work out its length in terms of μm on the surface of the wafer in order to cancel any magnification error and the like of the optical system of the wafer alignment sensor, and obtains the converted value UNT thereof (μm/point) in a real number. Here, it is assumed that a space Lt (μm) for designing the index marks TL and TR having excellent stability is applied. The space Lt is registered as a value on the wafer surface and should be converted to its UNT value by an equation given below. In this respect, both index marks TL and TR are assumed to be Kt lines (in the present invention, Kt=2).

$$UNT = \frac{2Kt \cdot Lt}{\sum_{n=Kt+1}^{2Kt} \{SRU(n) + SRD(n)\} - \sum_{n=1}^{Kt} \{SRU(n) + SRD(n)\}}$$

[Step 114]

Subsequently, the processor 50 obtains the central position Ct(μm) between the index marks TL and TR in a real number in accordance with an equation given below.

$$Ct = \frac{\sum_{n=1}^{2Kt} \{SRU(n) + SRD(n)\}}{4Kt} \times UNT$$

[Step 116]

Here, an algorithm for working out the central position Cl of the wafer mark is selected in accordance the processing mode designated in advance. The step 116 to proceed to the next process (either one of the steps 118, 120, and 122) is instructed by an operator or is automatically switched by the auto-set-up system.

[Step 118]

Here, the central position Cl(μm) of the wafer mark is worked out in a real number by the inner slope detection method.

Now, the inner slope positions on the wafer mark waveform are SWU(1), SWD(2), SWU(3), SWD(4), SWU(5), SWD(6), SWU(7), and SWD(8) in reference to FIG. 10 described earlier.

Therefore, give the numbers of the wafer mark as Km here (in the present embodiment, Km=4), the central position Cl is worked out in accordance with an equation given below.

$$Cl = \frac{\sum_{n=1}^{2Km} \left[ \frac{1-(-1)^n}{2} \cdot \{SWU(n) + SWD(n+1)\} \right]}{2Km} \times UNT$$

[Step 120]

Here, the central position Cl(μm) of the wafer mark is worked out in a real number by the outer slope detection method.

Now, the outer slope positions of the wafer mark are SWD(1), SWU(2), SWD(3), SWU(4), SWD(5), SWU(6), SWD(7), and SWU(8) in reference to FIG. 10 described earlier.

Therefore, the central position Cl is worked out herein accordance with an equation given below.

$$Cl = \frac{\sum_{n=1}^{2Km} \left[ \frac{1-(-1)^n}{2} \cdot \{SWD(n) + SWU(n+1)\} \right]}{2Km} \times UNT$$

[Step 122]

Here, the central position Cl(μm) of the wafer mark is worked out in a real number by both of the slope detection methods.

As clear from FIG. 10 described earlier, the average position obtained after adding all the down-slopes and up-slopes on the wafer mark waveform becomes the center Cl. Therefore the center Cl is worked out in accordance with an equation given below.

$$Cl = \frac{\sum_{n=1}^{2Km} \{SWD(n) + SWU(n)\}}{4Km} \times UNT$$

[Step 124]

Subsequently, the processor 50 determines the alignment error ΔA(μm) by computing the difference between the central position Ct of the index mark and the central position Cl of the wafer mark.

This alignment error ΔA is the remaining alignment error of the wafer stage ST when the video signal waveform has been stored in the RAM 43. Therefore, in positioning the stage ST thereafter, it suffices if only the designed value of the stage positioning coordinate defined by the global alignment is offset by ΔA.

So far the fundamental alignment procedures for the present embodiment have been described. Now, an example will be described as to the selection of the processing mode at the step 116 according to the present embodiment.

Usually, among the processes to form a device on the semiconductor wafer, there is a process to deposit aluminum layer evenly thereon to produce wirings and others between the elements, and the irregularity of the alignment mark on the wafer is detected in such a state where the mark is covered by the aluminum layer. In other words, the detection is performed against the mark which is the aluminum layer itself.

As a result, if the aluminum layer is not deposited on the mark evenly and the mark becomes asymmetrical, the video signal waveform (bottom waveform) corresponding to the edge portion at each end of the mark also becomes asymmetrical. FIG. 13(a) shows the sectional structure of the alignment mark WM covered by the aluminum layer Al, and on the mark image projected on the screen of the television monitor, which has been picked up by the CCD 22, the width of the dark lines appearing on the edge portions on the left and right sides differs from each other as shown in FIG. 13(b).

This is due to the fact that the deposition of the aluminum layer Al is asymmetrical at the left and right edge portions of the mark WM as shown in FIG. 13(a). If this mark WM is observed by the use of a visible band illuminating light, it is usual that only the surface of the aluminum layer Al is seen. Accordingly, the video signal waveform output by the CCD 22 becomes as shown in FIG. 13(c), and the bottom waveforms corresponding to the left and right edge portions also become different from each other.

To a waveform such as this, the signal waveform processing algorithm of the present embodiment is applied to obtain the outer slope positions SWD(1), SWU(2), and the inner slope positions SWU(1), SWD(2). Then, if, at the step 122 shown in FIG. 8, both of the slope detection methods are selected, the central position Cl of the mark WM shown in FIG. 13 is obtained by an equation given below.

$$Cl = \{SWD(1) + SWU(2) + SWU(1) + SWD(2)\}/4$$

Nevertheless, it has been ascertained that when a mark with a conspicuous asymmetry such as this is detected by both of the slope detection methods to execute its alignment, the resultant precision is not necessarily sufficient.

One reason for this is that there is a problem for a vernier which examines the alignment accuracy (overlay accuracy).

In examining the overlay accuracy, the vernier on the reticle is positioned against the main scale of the vernier provided in advance on the wafer by the use of the alignment sensor to produce an over print of the vernier. Then, the alignment accuracy is judged by reading the degree of the deviation of the verniers produced by the over print.

Conventionally, this examination is carried out in such a manner that subsequent to the development of the wafer over printed by the use of stepper, the vernier formed by the resist and the main scale of the vernier on the substrate are observed by another optical microscope or the like to read the degree of the deviation of the verniers by eye-sight.

FIG. 14 and FIG. 15 illustrate an example of the vernier on the aluminum layer. FIG. 14 shows the case where the vernier WBS is penetratingly formed in the resist layer PR over the main scale of the vernier WBM. FIG. 15 shows the case where two verniers WBS are penetratingly formed in the resist layer PR over both sides of the main scale of the vernier WBM.

Here, the main scale of the vernier WBM is assumed to be asymmetric.

When these verniers are measured by eye-sight, the distances a and b between the edge portions of the vernier WBS in the resist and the adjacent edge portions of the main scale of the vernier respectively are read, and the position where these distances are identical by eye-sight is regarded as indicating the alignment accuracy.

Specifically, as shown in FIG. 16, the main scale WBM is produced with constant pitches in the measuring direction, and the vernier WBS to be overprinted thereon is provided with pitches larger than those of the main scale WBM by 0.02 μm each, for example. If the alignment is ideally performed, the centers of the main scale WBM and the vernier WBS are overlapped with each other at the position represented by a numeral 0 accompanying the vernier. In the case shown in FIG. 16, the centers of the main scale WBM and the vernier WBS are overlapped at the position represented by a numeral −0.2. Hence, the alignment accuracy obtained is −0.02 μm. In this respect, FIG. 16 illustrates the vernier patterns of the method shown in FIG. 14. The same is applicable to the method shown in FIG. 15.

Now, in the case of the vernier type shown in FIG. 14, the edge positions on the main scale WBM which regulate the distances a and b are the outer slope positions SWU(1) and SWD(2) if these edges should be located on the waveform shown in FIG. 13(c).

On the other hand, the vernier type shown in FIG. 15, the edge positions on the main scale WBM which regulate the distances a and b are the outer slope positions SWD(1) and SWU(2) if located on the waveform shown in FIG. 13(c).

In other words, when the actual alignment is performed it is necessary to select the outer slope detection method or the inner slope detection method by the vernier type that has been used for checking the alignment accuracy.

Therefore, in the case of the alignment checking by the vernier type shown in FIG. 14 (FIG. 16), the inner slope detection method (the step 118 in FIG. 8) is selected, and in the case of the vernier type shown in FIG. 15, the outer slope detection (the step 120 in FIG. 8) should be selected.

In this way, it is possible to coordinate precisely the alignment accuracy measured by the vernier scale with eye-sight and the alignment error detected by the wafer alignment sensor.

However, depending on the ways of process, the alignment should sometimes be performed with the mark WM under the aluminum layer Al. In such a case, it is difficult to define the degree of asymmetry of the aluminum layer Al formed on the mark WM. Therefore, subsequent to the verification of the asymmetry thereof by examining the sectional structure of the mark, an automatic selection should be arranged to provide a more weight on the inner slope detection method or on the outer slope detection method in accordance with the degree of the asymmetry thus verified. For example, the central position of the mark Cl for a single mark waveform such as shown in FIG. 13(c) is determined by an equation given below.

$$Cl = \frac{A\{SWD(1) + SWU(2)\} + B\{SWU(1) + SWD(2)\}}{2(A + B)}$$

This equation is a modification of the equation for the detection method for both slopes with the insertion of the weighted constants A and B, and if only the condition given below is satisfied, the constants A and B are applicable.

$$0 < A < 2,\ 0 < B < 2,\ A + B = 2$$

Here, if the weighted constants A and B are given as 1 for both of them, then the related equation is for the detection method for both slopes.

In this respect, as a method of examining the sectional structure of the mark, there are considered such method as using a scanning electron microscope (SEM) measuring machine or a ultrasonic microscope, or such method as applying an optical measurement by the use of an infrared laser spot or illuminating light capable of transmitting itself through the aluminum layer Al.

Figure 17:
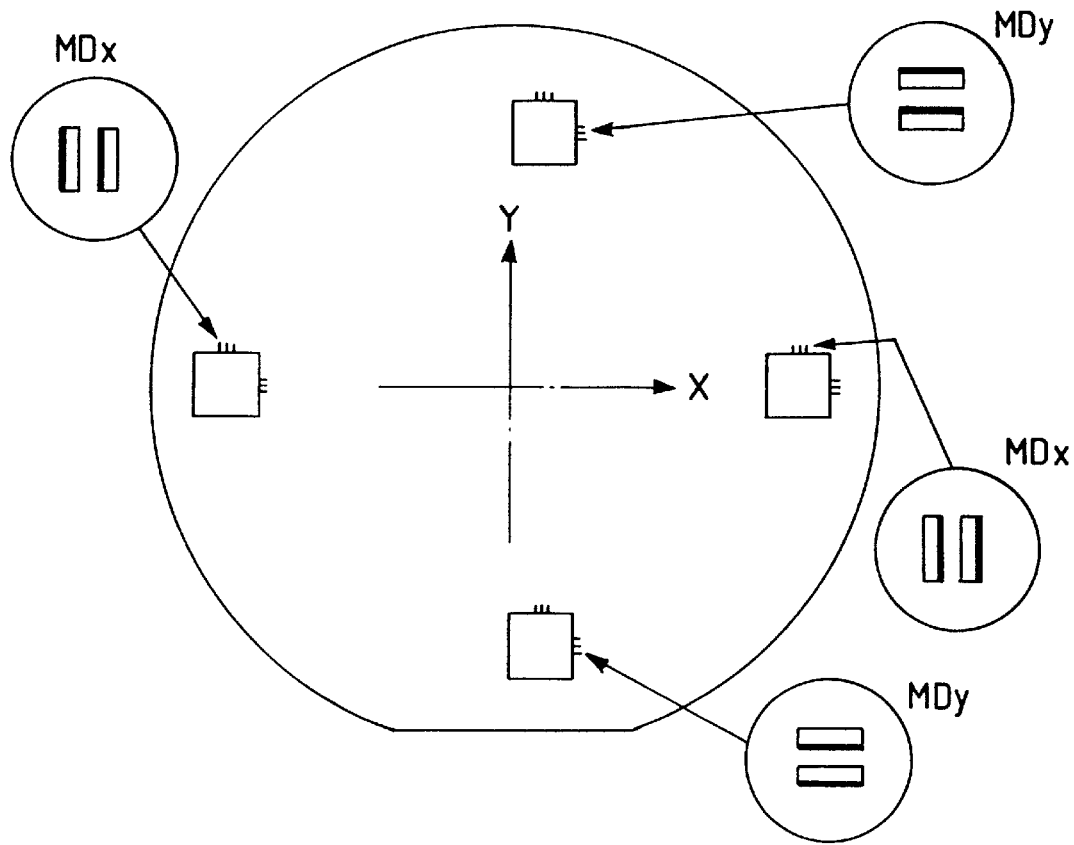
FIG. 17 is a wafer plan view showing the state of the mark becoming asymmetric in the peripheral shots.

Now, the asymmetry of the aluminum layer Al, when it is deposited, tends to expand isotropically from the center of the wafer, and it is possible to recognize the asymmetry as shown in FIG. 17, for example, at the position where the shot (chip) marks positioned at the periphery of the wafer surface are observed by eye-sight through the wafer alignment sensor.

FIG. 17 shows the four shot positions at the periphery on the shot arrangement coordinate XY with the wafer center as its substantial home position. For each shot, the marks respectively for the X direction alignment and Y direction alignment are provided. For the two shots positioned apart from each other in the Y axis direction on the coordinate XY, the mark MDy for the Y direction alignment is observed while, for the two shots apart from each other in the X axis direction, the mark MDx for the X direction alignment is observed.

At this juncture, the signal waveform of each mark picked up by the CCD 22 is processed to obtain the width of the bottom waveform at the mark edge portions, i.e., the difference between the positions SWD(1) and SWU(1) shown in FIG. 13(c), and the difference between the positions SWD(2) and SWU(2). Hence, it becomes clear that there is an intensified asymmetry on the edge having the larger difference. The amount of this asymmetry $\Delta U$ is obtainable by an equation given below.

$$\Delta U = \frac{\{SWD(1) + SWU(2)\} - \{SWU(1) + SWD(2)\}}{2}$$

In this way, some of the shot marks on the periphery of the wafer are detected, and obtaining the amounts of the asymmetry $\Delta U$ at those positions makes it possible to define the asymmetry at the time of the aluminum layer deposition almost over the entire surface of the wafer.

Therefore, as shown in FIG. 1, in the stepper provided with the detection system to detect the die-by-die mark on the reticle R and the mark for one shot portion on the wafer W with the TTR alignment system DAS1–DAS4, it becomes possible to correct the wafer mark position aligned by the TTR alignment system in response to the asymmetry of the mark.

Here, as an example of the TTR alignment system, the interference alignment system disclosed in U.S. Pat. No. 5,004,348 is considered.

Figure 18:
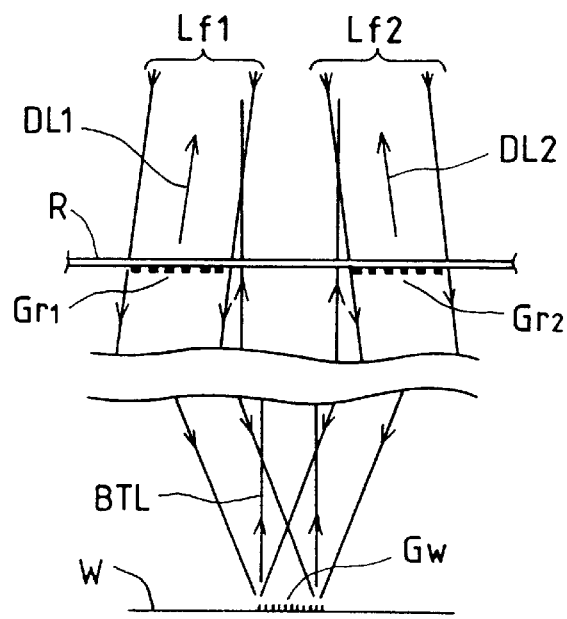
FIG. 18 is a view illustrating an example of TTR alignment sensor.

FIG. 18 is a view schematically showing an interference alignment system which is, through slightly different from the one disclosed in this U.S. patent, identical in its principle.

On the reticle R, refraction gratings Gr1 and Gr2 are provided apart from each other in the grating pitch direction in two transparent windows as die-by-die marks, and two laser beams Lf1 and Lf2 having the wavelength different from the exposure light are slantly irradiated onto the gratings Gr1 and Gr2 respectively. The major rays of light for the beams Lf1 and Lf2 are intersected in the space above the reticle R, and the space between the optical axis directions of such intersecting point and reticle R corresponds to the the amount of the chromatic aberration on the axis of the projection lens in the wavelength of the beams Lf1 and Lf2. The beams Lf1 and Lf2 transmitting themselves through the transversal transparent portions of the gratings Gr1 and Gr2 on the reticle R intersect with each other on the wafer W through the projection lens. In the intersecting region, one-dimensional. interference fringe is produced in parallel with the refraction grating Gw on the wafer W. From the grating Gw on the wafer W, the coherent light BTL interfered by±primary refraction light is generated vertically, and this coherent light BTL reversely advance in the projection lens to be photoelectrically converted through the center of the transparent window of the reticle R. Here, if a frequency differential $\Delta f$ is given to the two beams Lf1 and Lf2, the interference strip formed on the grating Gw of the wafer W flows at a speed in response to the frequency differential $\Delta f$, and the photoelectrical signal (measuring signal) of the coherent light BTL becomes the alternating current signal which changes into a sine wave state by the frequency $\Delta f$.

Meanwhile, from the grating Gr1 and Gr2 of the reticle R, the±primary refraction lights DL1 and DL2 are generated in the reverse direction to the light transmitting beams Lf1 and Lf2, and the reference signal is produced by photoelectrically detecting the coherent light interfering these±primary refraction lights DL1 and DL2.

This reference signal also becomes the alternating current signal which changes into the sine wave state by the frequency $\Delta f$, and the phase difference $\Delta\phi$ (within±180°) between the reference signal and the measuring signal becomes the amount of the deviation in the pitch direction between the gratings Gr1 and Gr2 of the reticle R and the grating Gw of the wafer W. The system in which the frequency differential $\Delta f$ is given to the two beams Lf1 and Lf2 in this way is called especially the heterodyne interference alignment system which is capable of detecting a positional deviation of approximately ±0.01 $\mu$m as a system thereby obtaining a phase differential measuring resolution of ±2° because the maximum phase differential ±180° corresponds to ±1 $\mu$m when the pitch of the grating Gw is set to be approximately 4 $\mu$m (line-and-space of 2 $\mu$m wide).

Now, if a high-precision, high-resolution TTR alignment sensor is used and there is an asymmetry generated for each of the grating elements of the grating mark Gw on the wafer W, error (offset) is included in the resultant mark position detection as a matter of course. Subsequently, therefore, a method of offset correction will be described, in which the asymmetry of the mark presenting a problem in a TTR alignment system of the kind is estimated for the correction by the wafer alignment sensor using a wideband illuminating light.

FIG. 19(a) shows the sectional shape of the grating mark Gw on the wafer W, and the edge on the right side of each of the grating elements is deformed. As a result, even if the TTR alignment system shown in FIG. 18 is used to perform the alignment with the gratings Gr1 and Gr2 of the reticle R by flowing the interference strip IF to detect the grating mark Gw with the helerodyne detection, there still remains an offset such as averaging the sum of the asymmetry of each of the grating elements.

Therefore, in the same way as the embodiment described earlier, the grating mark Gw is picked up by the CCD 22. At this juncture, the horizontal scanning direction of the CCD is arranged to be in parallel with the pitch direction of the grating mark Gw. Thus, as shown in FIG. 19(b), the video signal waveform from the CCD 22 becomes the bottom waveform asymmetrical at the edge portions of both sides of each grating element. Then, as described in conjunction with FIG. 13, the down-slope position SWD(n) and up-slope position SWU(n) are obtained. Further, when the amount of asymmetry $\Delta U(n)$ is worked out for each of the grating elements and is averaged, the amount of the asymmetry as a whole is obtained for the grating mark Gw. Therefore, at the time of the die-by-die alignment, if the alignment is performed by the TTR alignment system in accordance with its resultant mark position detection and the offset based on this amount thus worked out, it is possible to reduce error due to the asymmetry of the mark even when a TTR alignment system using a single wavelength illuminating beam is employed.

Next, in reference to FIGS. 20A, 20B and 20C, the description will be made of the case where the clear bottom waveform does not appear at the edge portions of the alignment mark in terms of the signal process algorithm.

FIG. 20A shows the case where the reflection factor of the multimark MD (convex portion) on the wafer is extremely different from its peripheral reflection factor. The signal waveform at this time shows a shape of the waveform corresponding to the contrast difference between the mark and the substrate.

FIG. 20B shows the case where the line and space duty of the multimark MD is set to be a value other than 50%, and if the line width of the adjacent covex bar mark is narrow, the bottom waveform at the left and right edges is not separated and becomes a single bottom waveform.

Also, FIG. 20C shows the case where each of the bar marks of the multimark MD is formed by a square dot to constract the grating. In this case, it is also impossible to obtain a clear bottom waveform. The waveform becomes a short form wave.

In either case of those shown in FIGS. 20A, 20B, and 20C, the inner slope detection method cannot be utilized. Only the outer slope detection method is employed. As described in the embodiment earlier, the wafer mark lines Km is defined in advance as an operation for the algorithm, and it is assumed that the bottom waveform having a constant contrast on the signal waveform is obtained only for the number 2 Km. As a result, an error tends to occur in the algorithm (operation) if the bottom waveform generated at the mark edge portions is not clear.

Therefore, a routine for judging the contrast is added to the flowchart shown in FIG. 8, so that the processing system automatically selects the step 120 in FIG. 8 if the signal waveform shows the state as shown in FIG. 20.

FIG. 21 is a flowchart showing an example of such contrast judgement routine, which is executed in place of the step 116 shown in FIG. 8.

Hereinafter each of the steps shown in FIG. 21 will be described.

[Step 200]

Here, zero is set for the inner counter (software counter) FN of the processor. This counter FN is provided for discriminating the waveform shown in FIG. 20 from the normal waveform shown in FIG. 10.

[Step 202]

Figure 22:
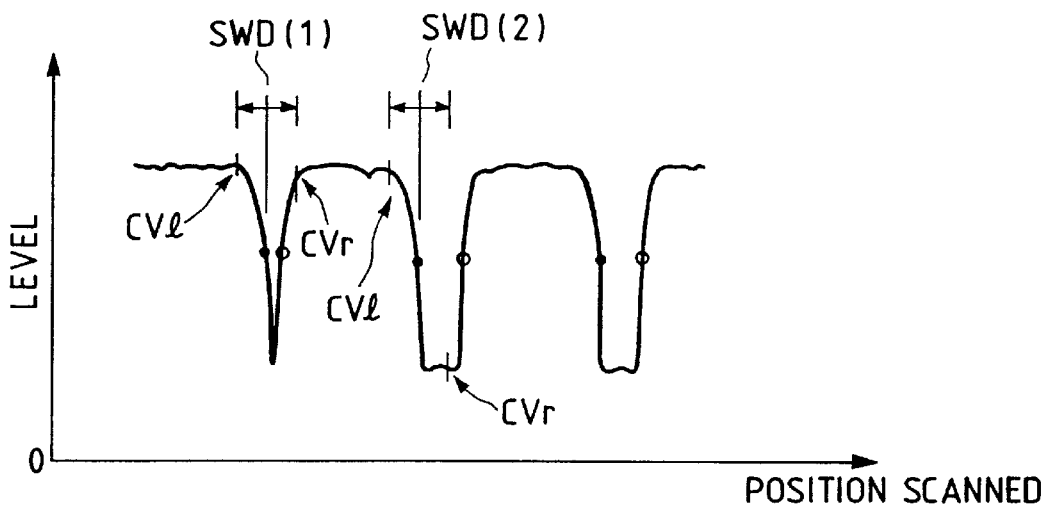
FIG. 22 is a view showing the waveform illustrating an example of the signal waveform processing in the process shown in FIG. 21.

Here, assuming that the waveform shown in FIG. 22 is obtained, the description will be made.

At first, since the down-slope position SWD(n) or WD(n) in the waveform shown in FIG. 22 has been obtained, the contrast values (levels) CVl and CVr each at a predetermined position to the left and right therefrom are obtained. The predetermined distance of this position is substantially equal to or slightly longer than the width of the normal bottom waveform at the edge.

[Step 204]

Subsequently, the processor works out the difference between the contrast values CVl and CVr, and judges whether the difference is larger than a predetermined value GC or not.

The first bottom waveform in FIG. 22 is normal, corresponding to the mark edge portion only. Accordingly, the difference between the contrast values CVl and CVr is not so large, and the process proceeds to the step 206.

[Step 206]

Here, the content of the counter FN is incremented by 1(+1).

[Step 208]

The processor judges whether all down-slope positions SWD(n) have been checked or not, and if the check has not been completed, the processor instructs a jump to the step 202 to execute the same process for the next down-slope.

[Step 210]

Here the processor judges whether or not the content of the counter PN still remains zero. The counter FN is not incremented in a state such as the down-slope position SWD(2) being in FIG. 22, i.e., the difference between the contrast value CVl and CVr at fore and after of the position SWD(2) is greater than the value GC. Consequently, if the counter FN is zero, it is meant that the signal waveform is in the condition shown in FIG. 20, and the processor executes automatically (forcibly) the step 120 to perform the outer slope detection.

[Step 212]

Also, if the counter FN is not zero, the processor compares the counted value with the wafer mark line number Km, and judges that the signal waveform is in the condition shown in FIG. 22 if the value and the number do not coincide. Then, the step 118 is executed to perform the inner slope detection.

Further, if the value of the counter FN coincides with the mark number Km, the processor judges that the normal bottom waveform has been generated with respect to all the mark edge portions, and executes a processing mode (either one of the three slope detection methods) designated in advance by the user (operator). It is apparent that if the value of the counter FN does not coincide with the mark number Km, a processing mode employing outer slope detection (as well as a processing mode employing both outer and inner slope detection) is prohibited.

As the above describes, even when such waveform as shown in FIG. 20 is obtained, the process can be executed without errors in terms of the algorithm. Nevertheless, in the case of the mark shown in FIG. 20, only the otter slope detection method is usuable. Therefore, even if the inner slope detection method is found to be optimum in consideration of the asymmetry based on the vernier configuration as described in conjunction with FIG. 14 and FIG. 15, this is not usable after all. For example, in the case of a multimark having one extremely narrow convex bar mark as shown in FIG. 20C or FIG. 20B, there appears conspicuous the difference affected by the asymmetry based on the vernier configuration.

In such a case, therefore, it is possible to utilize an optimum slope detection method to be determined by the vernier configuration by replacing the convex bar mark with a concave bar mark.

In this respect, if the multimark of line-and space as shown in FIG. 20B earlier is used, only one bottom waveform is generated for one bar mark. The arrangement can be made so as to obtain the bottom waveform which is separated at the edges of both sides of one bar mark while changing the duty ratio of the line-and-space. This method is effectively applicable to the wafer grating Gw of the interference alignment system shown in FIG. 19. In the interference alignment system, the narrower the pitch of the grating mark Gw, the higher becomes its resolution. However, for the wafer alignment sensor using the CCD 22, if the pitch of the grating mark Gw is narrower, the waveform of the video signal becomes such as shown in FIG. 20A, and the contrast is further worsened. Therefore, by changing the duty ratio without changing the pitch of the grating mark Gw, it is possible to produce the waveform of the video signal as close as possible to the one shown in FIG. 19 or FIG. 20B.

Figure 23:
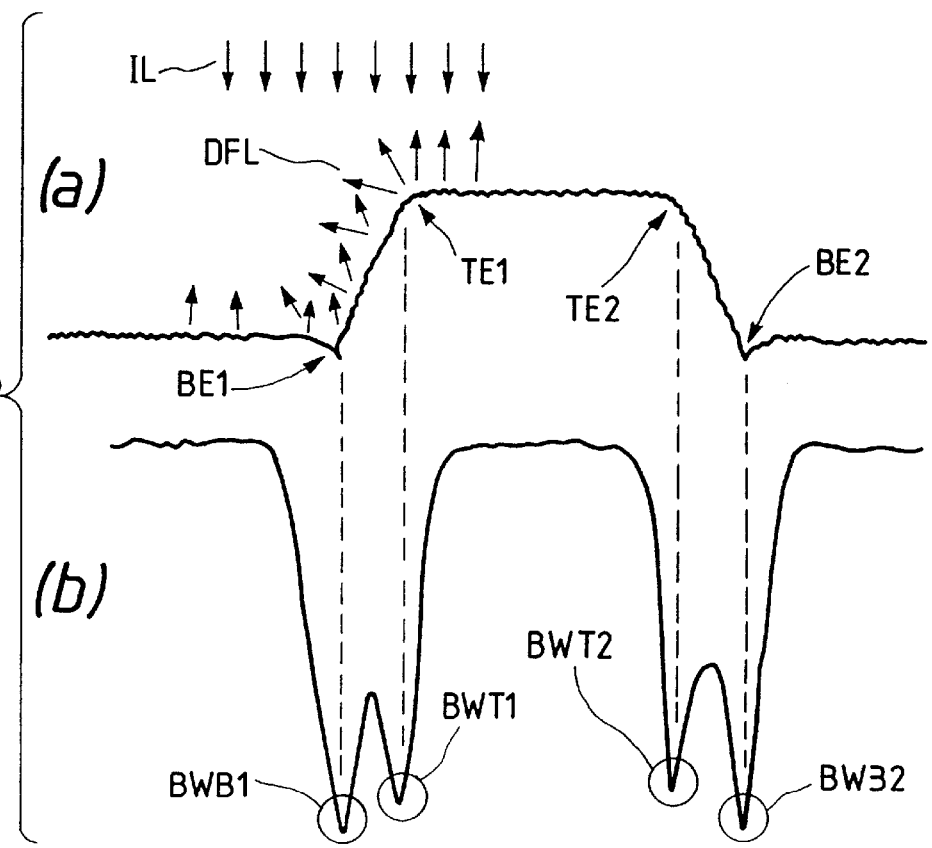
FIGS. 23(a) and (b) are views showing the mark structure illustrating the split top phenomenon of the edge bottom wave and its signal waveform.

In the apparatus of the present embodiment, the illuminating light for observing the wafer mark is wideband, and there is no interference phenomenon due to the resist layer at all. Therefore, in order to increase the resolution (magnifying power), it is possible to make lower the aperture number (N.A.) of the optical system (objective lens 12) before the CCD 22. Then, it becomes impossible to obtain any practicable depth of focus. Therefore, the aperture number of the objective lens 12 is set to be approximately half of the projection lens PL, N.A.=approximately 0.2–0.3, for example. Further, the total image-formation magnifying power, which is determined by the optical system (12 and 16) from the wafer surface to the conjugate index plate 18 and the optical system (20) from the conjugate index plate 18 to the CCD 22, is set to be approximately 30–50. In this way, even when the line-and-space of the practicable multimark is set to be 4 μm (pitch 8 μm), there is no split top phenomenon appearing in the bottom waveform on the video signal waveform with respect to the mark edge portion. The split top phenomenon means that in consideration of the cross-section of the convex bar mark shown in FIG. 23(a), each of the bottom edges (outer edges) BE1 and BE2 and the top edges (inner edges) TE1 and TE2 is separated to be the bottom waveforms BWB1, BWB2, BWT1, and BWT2 as shown in FIG. 23(b). This is caused by the fact that even when the illuminating light IL is irradiated in the direction perpendicular to the edge taper portion between the bottom edge BE1 (BE2) and the top edge TE1 (TE2), the scattered rays of light DFL from the tapered portion are returned to the CCD 22 if the aperture number of the objective lens 12 is large and its magnifying power is high.

Consequently, if the video signal shown in FIG. 23(b), which is supplied to a television monitor, is observed on its screen, the edge portions of the bar mark look like two fine black lines.

When the signal waveform with the split top phenomenon is processed, there is some case where the separated bottom waveforms BWB1 and BWT1 are erroneously recognized as two edges.

In the apparatus of the present embodiment, the configuration changes of the wafer mark in the course of processes are experimentally considered so as not to create such split top phenomenon as this, and the aperture number of the objective lens 12 is set comparatively small to be 0.2–0.3 and the magnifing power to the CCD 22 is set to be 30–50. Further, the cell size (cell pitch) of the CCD 22 is approximately 0.2 μm–0.3 μm in terms of the wafer surface.

Figure 24:
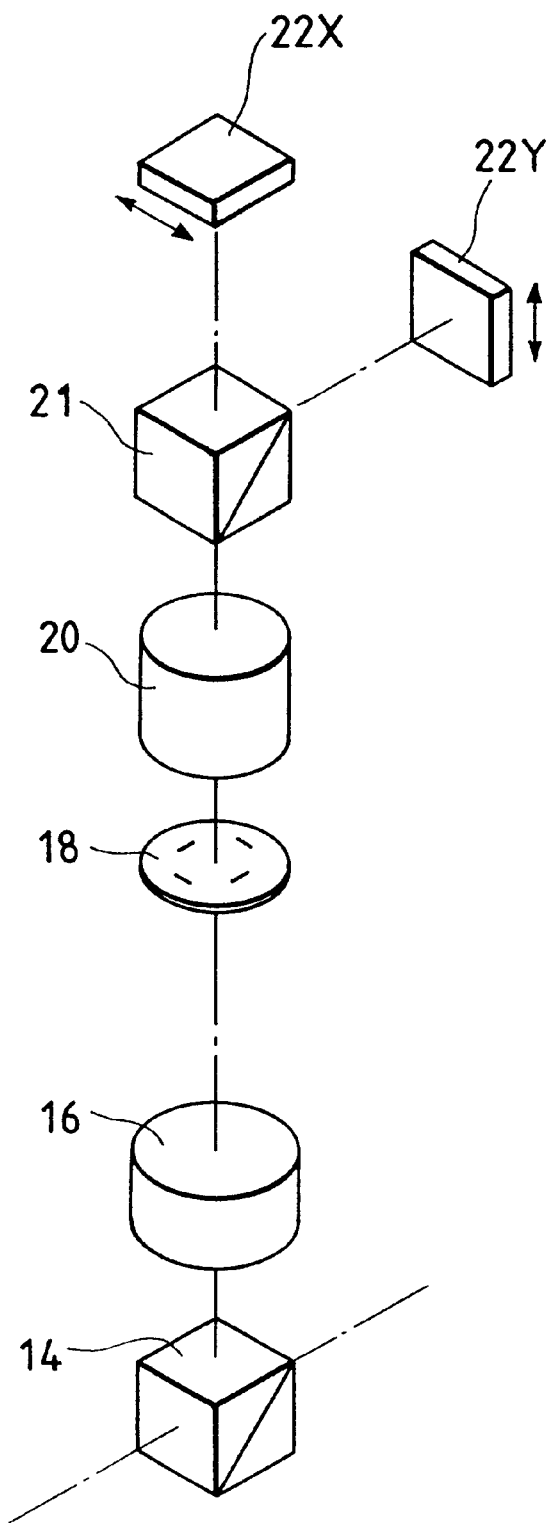
FIG. 24 is a perspective view showing another embodiment of the wafer alignment sensor shown in FIG. 1.

Subsequently, in reference to FIG. 24 and FIG. 25, the system configuration of a second embodiment according to the present invention will be described. In the present embodiment, the conjugate index plate 18, the structure of the CCD 22, and the method of the wafer mark alignment differ from those in the previous embodiment. FIG. 24 shows the system in the case where the mark in the X direction on the wafer W and the one in the Y direction thereon are detected through a common optical system, and what differs from FIG. 1 is that two sets of index mark groups are formed on the index plate 18, each in the X direction and Y direction thereon; a beam splitter 21 is provided after the image-formation lens system 20 to divide the image-formation beam into two; and two CCD's 22X and 22Y are provided to receive such divided image-formation beams respectively. However, the two CCD's 22X and 22Y are set up so that the horizontal scanning directions thereof are at angles of 90° to each other as indicated by arrow.

Figure 25:
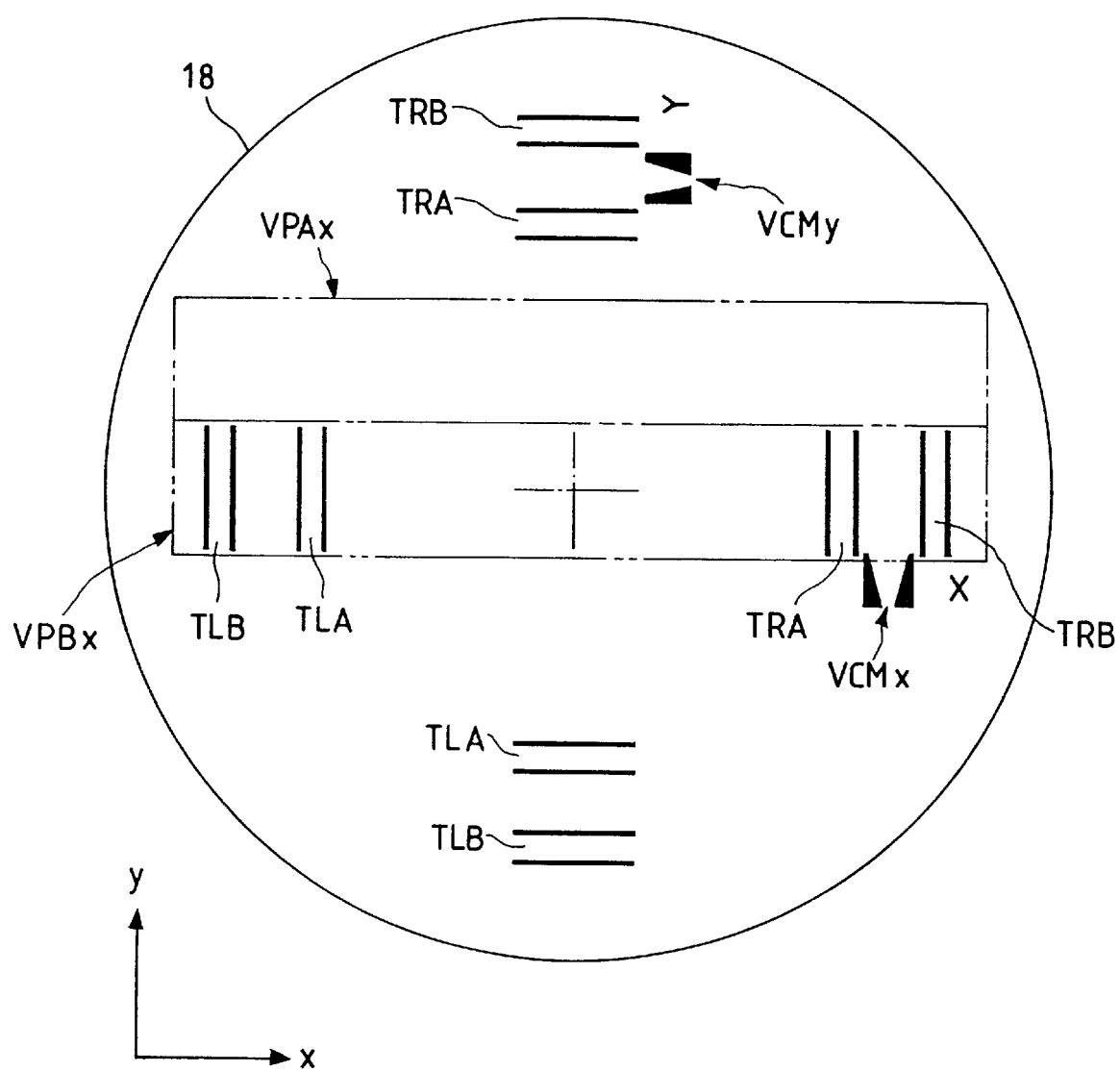
FIG. 25 is a plan view showing the mark arrangement on a conjugate index plate suited for the system shown in FIG. 24.

Further the conjugate index plate 18 is provided, as shown in FIG. 25, with a region VPBx including the index mark groups TLA, TRA, TLB, and TRB in the X direction, and a transparent region VPAx above them, and a mark VCMx for eye-sight. Likewise, in the Y direction, the index mark groups TLA, TRA, TLB, and TRB, and a mark $CVM_y$ for eye-sight are provided.

The CCD 22X covers the regions VPAx and VPBx, and the mark VCMx, and is provided with a pick-up area which does not take in the index marks TRA and TLA in the Y direction. The same is applicable to the CCD 22Y. In the present embodiment, the conjugate index plate 18, and the system up to the image-formation lens system 20 are used in common both in the X and Y directions. Accordingly, the mirror 10 to observe the wafer surface, and the objective lens 12 are arranged at one location only.

In this respect, if the alignment optical system for the X direction and Y direction is each arranged independent of the objective lens, the conjugate index plate 18 is also separated for the X direction use and Y direction use as a matter of course.

Now, the inner index marks TLA and TRA among those conjugate index mark groups shown in FIG. 25 are produced as an example to sandwich a multimark having seven bar marks of each 4 μm wide at intervals of 4 μm space. Therefore, in a case of detecting a single mark, not multimark, or the like, the wafer surface below each of the index marks TRA and TLA inevitably becomes a prohibitive region for marks or patterns. In other words, the formation region for the wafer mark should be provide widely on the street line, which restricts device fabrications.

In the present embodiment, therefore, at the time of detecting a single mark for the X direction use, the arrangement is made to sandwich the single mark between the index marks TRA and TRB on the right side of FIG. 25, and the video waveform portion including the index marks TRA and TRB only is processed.

Also, for a wide mark, the index marks TLB and TRB may be used.

Figure 26:
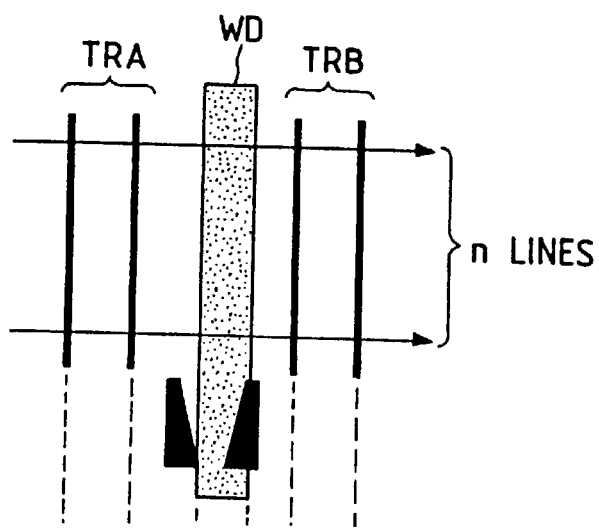
FIGS. 26(a), (b), 27(a) and (b) are views showing the usage of the index mark shown in FIG. 25 and the method of the signal processing respectively.
Figure 26:
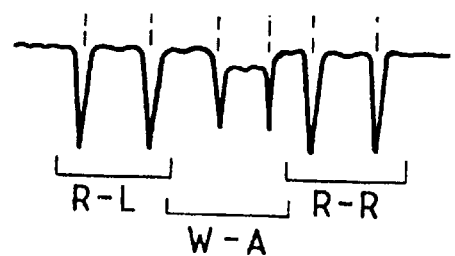
Figure 27:
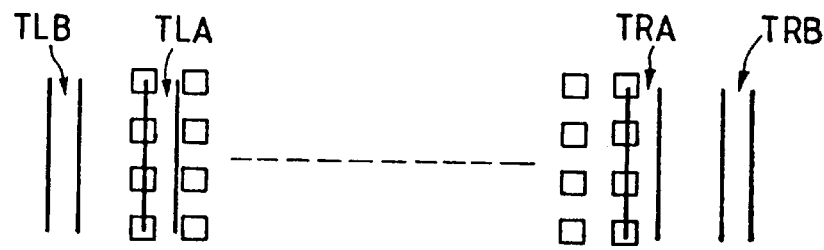
Figure 27:
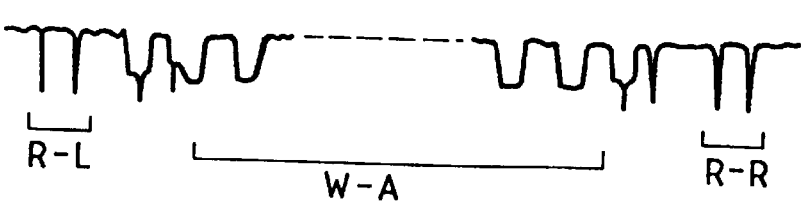

Specifically, as shown in FIG. 26, the single mark WD is sandwiched by the index marks TRA and TRB, and from the averaged waveform obtained by adding the video signals of n line scannings, the waveform portions in the index mark processing regions R-L and R—R given as parameter in advance and the waveform portion in the wafer mark processing region W-A between them are selected to form the signal waveform in the same way as in the previous first embodiment. Also, as to the multimark which is wider as a whole, the index mark processing regions R-L and R—R should be set up so as to use the outer index marks TLB and TRB as shown in FIG. 27, and the wafer mark processing region W-A should be set up so as to remove the wafer mark waveform portion which is overlapped with the inner index marks TLA and TRA. The set up of these processing regions is automatically executed by registering the mark configurations and dimensions to be used in advance.

Also, there is some case where the mark is overlapped with the index mark to be used depending on the contour of the registered mark. It may be possible to avoid such overlapping with the index mark by intentionally shifting the specific wafer mark position in the X or Y direction (measuring direction) subsequent to the wafer global alignment.

Next, a third embodiment will be described. Here, the description is made of the case where the wafer alignment sensor of the off-axis type shown in FIG. 1 is utilized for the wafer global alignment.

In general, a stepper of the kind is used to detect the orientation flat of a wafer to position the wafer mechanically (prealignment), and mount it on the stage ST. In such state, however, a prealignment error of approximately 20 μm–100 μm exists. The global alignment is a process to search the global alignment marks on the wafer with the prealignment error in view and coordinate the actual shot arrangement with the designed shot arrangement within the error range of approximately ±1 μm. Therefore, when a CCD camera is used for the global alignment, there may be some case where the global mark is not found in the pick-up region of the CCD camera if the prealignment error is great even when the stage ST is positioned by the designed value.

Then, it is necessary to perform the global search thereby to observe the wafer surface with CCD and shift the wafer gradually by a predetermined amount when the global alignment is carried out for the wafer W by picking up the wafer surface by the CCD camera. For this purpose, the transparent region VPAx (or VPAy) of the index plate 18 shown in FIG. 25 is used. Since this region VPAx is positioned in advance at a predetermined location on the pick-up surface for the CCD 22X, the scanning positions and lines for scanning the region VPAx are known in advance. Also, the global mark WGM on the wafer should be formed within the street line SAL shown in FIG. 28.

This global mark WGM is formed with three grating type marks arranged in parallel along the Y direction in which the street line SAL extends, and the distance from the chip region CPA on the left side of the street line SAL to the first grating type mark is designated by a reference mark a, while the distance from the chip region CPA on the right side to the third grating type mark is designated by a reference mark d. Further, the spaces between the three grating type marks are b and c respectively.

Figure 28:
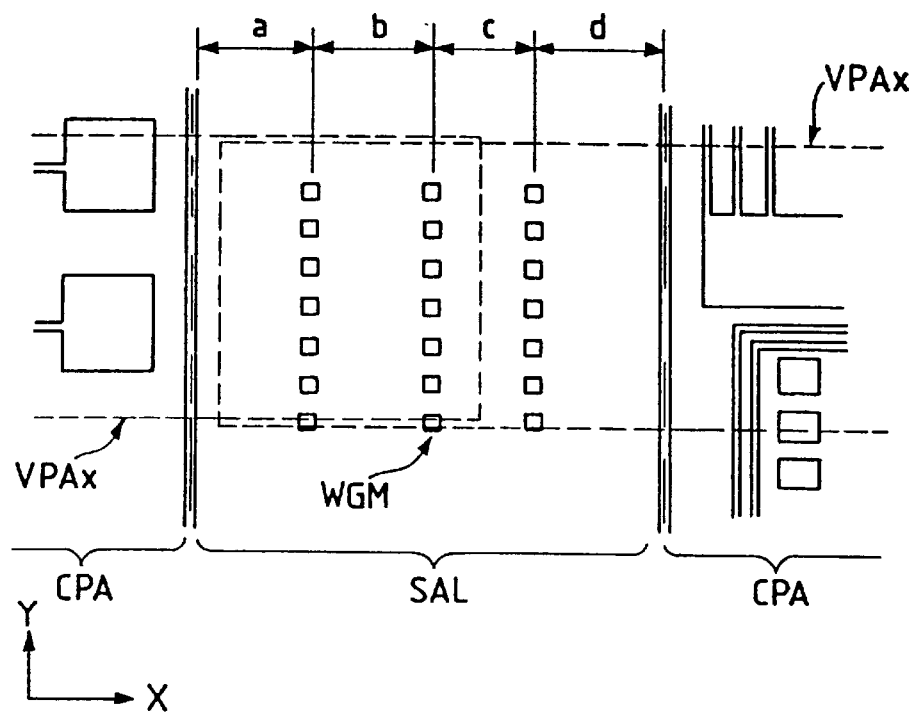
FIG. 28 is a plan view showing the relationship between the global alignment mark arrangement and the pick-up range at the time of search alignment.

Here, it is assumed that as shown in FIG. 28, the transparent region VPAx of the index plate 18 is placed mainly over the chip region CPA on the left side when the wafer stage ST is initially positioned in accordance with the designed value to take in the first and second columns of the global mark WGM. At this juncture, if the video signals corresponding to plural lines of scannings in the region VPAx are added to obtain its average, such waveform data as shown in FIG. 29(*a*) are stored in the memory.

Subsequently, the waveform data initially stored are analyzed to verify whether these area for the global mark WGA or not. As an algorithm for such verification, the method disclosed in U.S. Pat. No. 4,723,221 is applicable, for example.

In other words, the waveform position which is the closest to the state of the positioned relationship (spaces a, b, c, and d) of the designed mark WGM shown in FIG. 28 is searched.

Figure 29A:
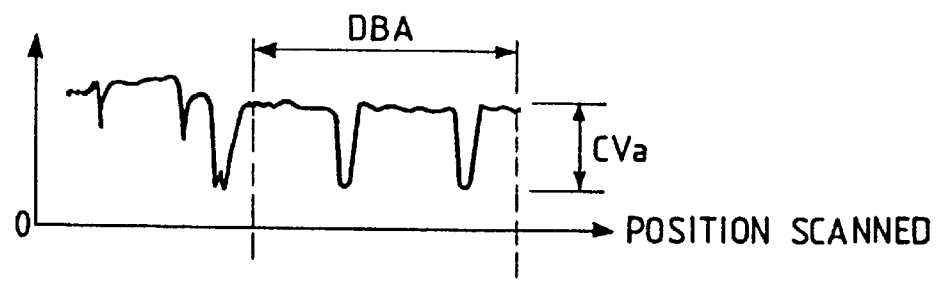
FIGS. 29(a) and (b) are views illustrating an example of the video waveform when the wafer shown in FIG. 28 picked up.
Figure 29B:
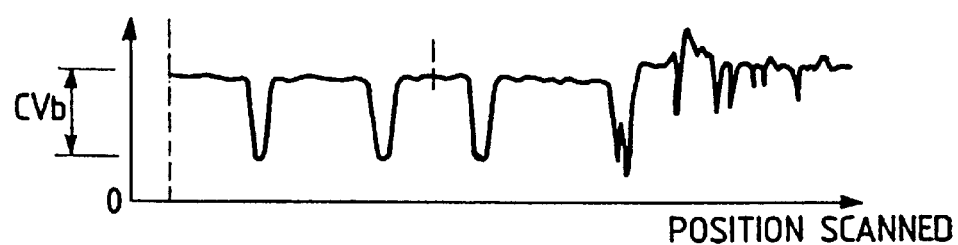

Usually, three columns of the mark WGM are included in the waveform data initially stored as in FIG. 29(*a*). However, if the prealignment error is extremely great, the region VPAx does not cover the mark WGM in the third column as shown in FIG. 28.

Thus, the processor stores in the memory the video signal waveform from the CCD camera subsequent to shifting the wafer stage ST in the X direction for a predetermined amount. At this juncture, the region VPAx is shifted to the right side of FIG. 28 to overlap itself partially with the initial portion. The averaged waveform obtained by the video signals from the region VPAx which has been shifted to the right side is such as shown in FIG. 29(*b*). In FIG. 29, the overlapped region in the X direction in the region VPAx is DBA, and although this length can be accurately set up by the interferometer IFX of the stage ST, it is desirable to define the region DBA to be slightly larger the width of the mark WGA in the X direction (approximately b+c).

Next, the processor compares the contrast value CVa of the overlapping region DBA of the video signal waveform which has been stored for the first time with the contrast value CVb of the overlapping region DBA of the video signal waveform which is stored for the second time.

In general, the CCD camera causes its AGC (auto-gain control) to operate when the average luminance of the image plane changes. Therefore, the contrast values CVa and CVb of the two waveform portions in the overlapping region DBA may change.

Therefore, if the two contrast values CVa and CVb differ greatly, the gain of either one of the first and second video signal waveforms is compensated by computation. Then, the two video signal waveforms are joined in the overlapping region DBA after averaging them. This process is executed by the processor operating the data stored in the memory.

Thus, if the video signal waveforms are joined by shifting the region VPAx relatively in the X direction, it is possible to store in the memory the video signal waveforms in succession from the region which is far wider than one single image plane of the CCD camera. Accordingly, it is possible to search the global mark WGM in the street line SAL based on the design rule (spaces a, b, c, and d).

As the above describes, the search on the global mark WGM is completed when the three columns of the mark have been recognized. Then, subsequent to this search, the processing proceeds to the global fine alignment. There are several examples of variations of the global fine alignment. Roughly, there are systems utilizing the wafer alignment sensor with the CCD camera employed for the present embodiment as it is, and the alignment sensor which is separately provided for the fine alignment.

In the case where the wafer alignment sensor with the CCD camera is utilized, the wafer stage ST is moved to arrange the global mark WGM in the region VPBx (FIG. 25) of the index plate 18 for the storage of the video signal waveform. Then, the alignment is precisely carried out by sandwiching index marks TLA and TRA or sandwiching the second column (single mark) of mark WGM with the index marks TRA and TRB.

Also, in the case of using the fine global sensor which is separately provided, only the second column of the mark WGM is immediately detected, and the coordinating value of the stage ST at which the detected center of the sensor and the center of the second column of the mark coincide with each other should be measured.

Subsequently, a forth embodiment will be described. Here, the description will be made of the case where the wafer alignment sensor of the off-axis type shown in FIG. 1 is utilized for E.G.A. (enhanced-global-alignment).

As regards the E.G.A., there is a detailed disclosure in U.S. Pat. No. 4,780,617. Here, therefore, the description of the detailed operation method thereof is omitted.

Figure 30:
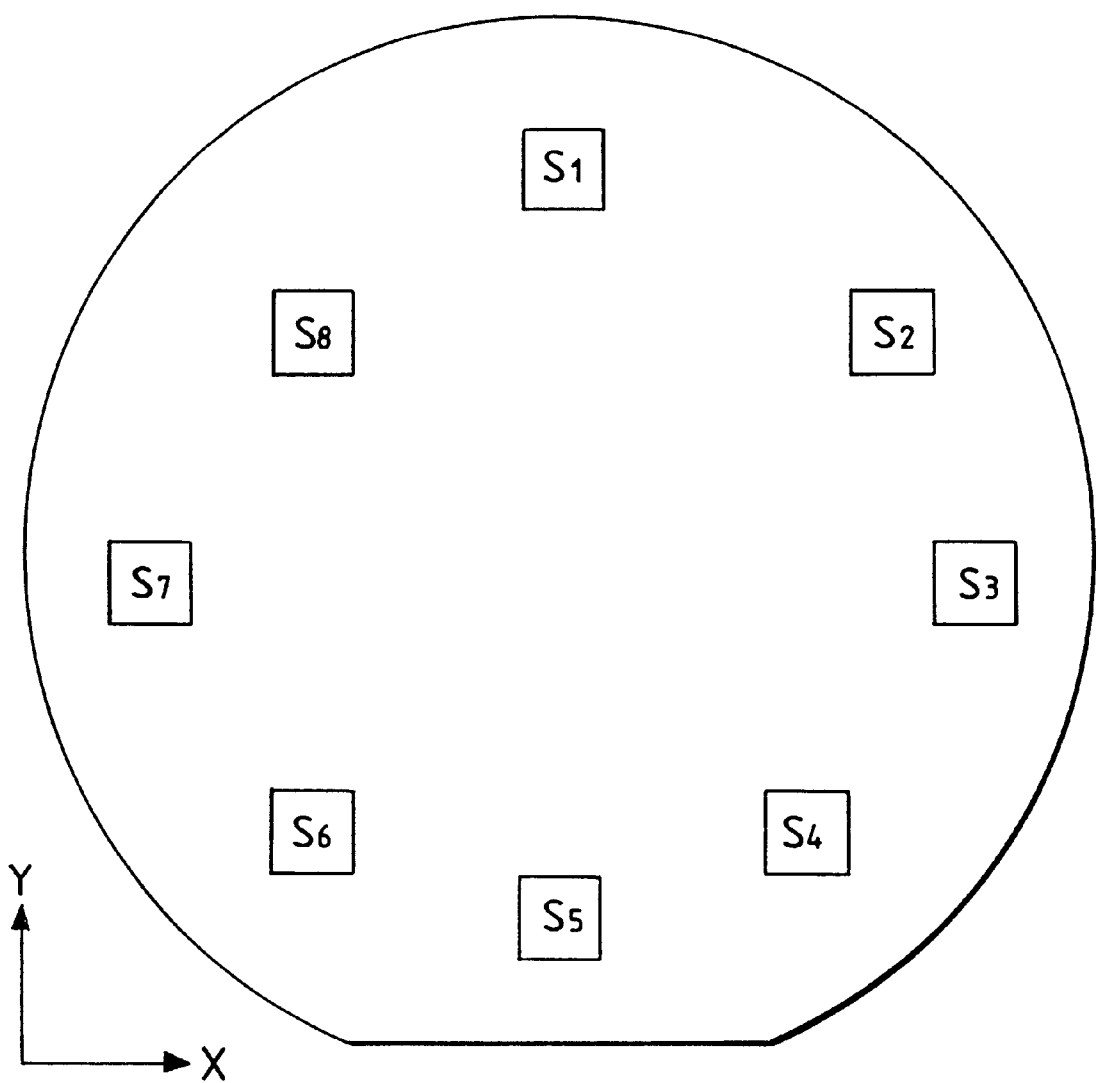
FIG. 30 is a plan view showing an example of the shot arrangement by the sample alignment with the E.G.A. method.

FIG. 30 shows only the shots S1–S8 which are given the sample alignment of E.G.A. system among the shot arrangement on the wafer. Traditionally, in the E.G.A. system, the sample alignment of the shots S1–S8 is executed subsequent to the completion of the global alignments in the X, Y, and θ directions, which is the prerequisite of this system.

In the present embodiment, the global alignment function in the θ direction is included in the E.G.A. sequence to improve its throughput. In the usual E.G.A., the marks in the X direction and Y direction for each shot are detected one after another in the sequence of the shots S1–S8 to measure the central coordinating value of each shot. In the present embodiment, however, the sample alignment is performed for those having substantially the point symmetry on the wafer in the first two shots. Specifically, those two are the shots S3 and S7 aligned in the X direction or shots S1 and S5 aligned in the Y direction in FIG. 30.

Then, when the sample alignment has been completed for the two shots, the rotation volume $\Delta\theta$ for the XY coordinate system for the wafer (shot arrangement) as a whole in worked out. Then, if this rotation volume $\Delta\theta$ is so great that it may lower the accuracy of the overall alignment in the E.G.A. system, the wafer holder on the wafer stage ST should be rotated in the reverse direction finely by the volume $\Delta\theta$.

Subsequently, the two shots are again given the sample alignment to verify that the rotation volume $\Delta\theta$ between sufficiently small. Then, the sample alignments are performed for the remaining shots to execute the E.G.A. operation.

In the above-mentioned sample alignments, the wafer alignment sensor shown in FIG. 1 and others is used to pick up the multimark with the wideband illuminating light. Therefore, there is no interference phenomenon due to the resist layer, and it is possible to carry out a stable measurement of the mark positions. In the mark position measurements, at the same time that the amounts of deviation $\Delta x$ and $\Delta y$ between the center Ct of the index marks TL and TR and the center Cl of the wafer mark are obtained, the stop coordinating value of the stage ST at that the should be read from the interferometers IFX and IFY for the storage.

As set forth above, in each of the embodiments according to the present invention, the descriptions have been made mainly of the utilization of the alignment sensor for the mark image detection using the wideband illuminating light in consideration of the influence of the resist layer on the wafer. In the recent years, however, there has been proposed a method whereby to remove the resist layer only for the wafer mark portions. In this case, it is unnecessary to provide a wideband mark illumination light, and an alignment sensor using an illuminating light of single wavelength such as laser light can possibly be employed. The present invention is equally applicable to the case where the waveform of the video signal or photoelectrical signal obtained by the alignment sensor using the illuminating light of such single wave length is analyzed. In such a case, if the resist layer for the mark portions has been removed, the waveform becomes a simple waveform such as having its bottom (or peak) at the mark edge as shown in each of the embodiments, and it is equally possible to deal with the effect of the asymmetry of the mark.

I claim:

1. An apparatus for detecting alignment marks formed on a photosensitive substrate, the substrate having a plurality of shot areas upon which a mask pattern image is to be exposed through a projection optical system and having the alignment marks annexed to the shot areas, respectively, the apparatus comprising:

(a) a first detection system for photoelectrically detecting light generated from an alignment mark through said projection optical system when said alignment mark is illuminated by a substantially single wavelength light beam, and determining a position of said alignment mark;

(b) a second detection system including an objective lens disposed outside of a projection field of said projection optical system, a light source for generating broad-band illumination light onto an alignment mark through said objective lens, and an image pick-up device for picking up an image of said alignment mark formed by said objective lens and generating a photoelectric signal representing said alignment mark;

(c) a movable stage for moving said substrate relative to said objective lens so that a preselected alignment mark, annexed to a preselected shot area which is arranged near a periphery portion of the substrate, is positioned within an imaging field of said objective lens;

(d) an asymmetry measurement portion for measuring a degree of asymmetry of said preselected alignment mark based on two bottom waveform portions of said photoelectric signal generated from said image pick-up device, wherein said two bottom waveform portions correspond to a pair of edges defining a width of said preselected alignment mark; and (e) a correction portion for correcting the position determined by said first detection system in accordance with said degree of asymmetry measured by said asymmetry measurement portion.

2. An apparatus according to claim 1, wherein said asymmetry measurement portion includes a signal processor for calculating said degree of asymmetry by determining a width of each of said two bottom waveform portions, to provide two determined widths, and comparing the determined widths.

3. An exposure method of transferring an image of a mask pattern onto each of a plurality of shot areas on a substrate through a projection optical system, comprising the steps of:

(a) detecting a position of at least one of alignment marks annexed to the shot areas, on which a substantially single wavelength light beam is irradiated through the projection optical system;

(b) obtaining a photoelectric signal generated from an image pick-up device on which an image of an alignment mark selected among the alignment marks is formed by an objective lens disposed outside of a projection field of the projection optical system;

(c) measuring a degree of asymmetry of the selected alignment mark based on two bottom waveform portions of the photoelectric signal, the two bottom waveform portions corresponding to a pair of edges defining a width of the selected alignment mark; and (d) correcting the detected position of said at least one of the alignment marks in accordance with the measured degree of asymmetry.

4. A method according to claim 3, wherein each of said alignment marks includes a plurality of bar marks, and wherein upon measuring said degree of asymmetry of said selected alignment mark, a degree of asymmetry is detected for each of said plurality of bar marks.

5. A method according to claim 4, wherein said measured degree of asymmetry is an average of a plurality of degrees of asymmetry detected for said plurality of bar marks.

6. A method according to claim 5, wherein the position of said at least one of alignment marks is detected by receiving diffraction lights generated by said at least one of alignment marks when it is irradiated with said light beam, with said diffraction lights interfering with each other.

7. A method according to claim 6, wherein said light beam is irradiated on an alignment mark on said mask, and wherein said detected position corresponds to a relative positional relation between said mask and said substrate.

8. An exposure method of transferring an image of a mask pattern onto each of a plurality of shot areas on a substrate through a projection optical system, comprising the steps of:

(a) detecting a position of at least one of alignment marks annexed to the shot areas through the projection optical system;

(b) obtaining a photoelectric signal generated from an image pick-up device on which an image of an alignment mark selected among the alignment marks is formed by an objective lens other than the projection optical system;

(c) measuring a degree of asymmetry of the selected alignment mark based on waveform portions of the photoelectric signal, the waveform portions corresponding to a pair of edges defining a width of the selected alignment mark; and (d) moving the substrate relative to the mask pattern based on the detected position and the measured degree of asymmetry.

9. A method according to claim 8, wherein each of said alignment marks includes a plurality of bar marks, and wherein upon measuring said degree of asymmetry of said selected alignment mark, a degree of asymmetry is detected for each of said plurality of bar marks.

10. A method according to claim 9, wherein said measured degree of asymmetry is an average of a plurality of degrees of asymmetry detected for said plurality of bar marks.

11. A method according to claim 10, wherein said selected alignment mark is irradiated with a wide band light through said objective lens in order to obtain said photoelectric signal.

12. A method according to claim 11, wherein said at least one alignment mark is detected through said mask, and wherein said detected position corresponds to a relative positional relation between said mask and said substrate.

13. An exposure method of exposing each of a plurality of shot areas on a substrate with a light beam irradiated on a mask through a projection optical system, comprising the steps of:

(a) obtaining a signal generated from an image pick-up device on which an image of a mark on the substrate is formed;

(b) measuring a degree of asymmetry of the mark based on waveform portions of the signal, the waveform portions corresponding to a pair of edges defining a width of the mark; and (c) determining a positional relation between each shot area on the substrate and the mask based on the measured degree of asymmetry.

14. A method according to claim 13, wherein said mark includes a plurality of bar marks, and wherein upon measuring said degree of asymmetry of the mark, a degree of asymmetry is detected for each of said plurality of bar marks.

15. A method according to claim 14, wherein said measured degree of asymmetry is an average of a plurality of degrees of asymmetry detected for said plurality of bar marks.

16. A method according to claim 15, wherein said mark is irradiated with a wide band light in order to obtain said signal.

17. A method according to claim 16, further comprising:

(d) detecting an alignment mark on said substrate to obtain position information thereof, said position information being used in determining said positional relation.

18. A method according to claim 17, wherein said alignment mark is irradiated with a coherent beam in order to obtain said position information.

19. A method according to claim 18, wherein diffraction lights generated by said alignment mark when it is irradiated with said coherent beam are received, while said diffraction lights interfere with each other.

20. A method according to claim 19, wherein said coherent beam includes two beams which have wavelengths different from each other.

* * * * *